United States Patent [19]
Takemi et al.

[11] Patent Number: 5,539,763
[45] Date of Patent: Jul. 23, 1996

[54] SEMICONDUCTOR LASERS AND METHODS FOR FABRICATING SEMICONDUCTOR LASERS

[75] Inventors: Masayoshi Takemi; Hirotaka Kizuki, both of Itami, Japan

[73] Assignee: Mitsubishi Denki Kabushiki Kaisha, Tokyo, Japan

[21] Appl. No.: 302,488

[22] Filed: Sep. 12, 1994

[30] Foreign Application Priority Data

Sep. 22, 1993 [JP] Japan ................................. 5-236058

[51] Int. Cl.$^6$ .............................. H01S 3/18; H01L 27/15
[52] U.S. Cl. .................... 372/50; 372/26; 372/45
[58] Field of Search .................... 372/50, 26, 45

[56] References Cited

U.S. PATENT DOCUMENTS

| | | | |
|---|---|---|---|
| 3,993,963 | 11/1976 | Logan et al. | 331/94.5 |
| 4,523,316 | 6/1985 | Botez | 372/45 |
| 5,048,036 | 9/1991 | Scifries et al. | 372/45 |
| 5,119,393 | 6/1992 | Oka et al. | 372/50 |

FOREIGN PATENT DOCUMENTS 2273813  11/1993  United Kingdom.

OTHER PUBLICATIONS

Yamada et al, "Strained InGaAs/GaAs Single Quantum Well Lasers With Saturable Absorbers Fabricated By Quantum Well Intermixing", Applied Physics Letters, vol. 60, No. 20, May 1992, pp. 2463–2465.

Aoki et al, "High–Speed (10Gbit/s) And Low–Drive–Voltage (1V Peak To Peak) InGaAs/InGaAsP MQW Electroabsorption–Modulator Integrated DFB Laser With Semi–Insulating Buried Heterostructure", Electronics Letters, vol. 28, No. 12, Jun. 1992, pp. 1157–1158.

Maciejko et al, "Selective TE–TM Mode Pumping Efficiencies For Ridge–Waveguide Lasers In Presence Of Stress", IEEE Journal of Quantum Electronics, vol. 29, No. 1, 1993, pp. 51–61 (Jan.).

Xu et al, "Lateral Band Gap Modulation By Buried Stressor Structures In III–V Compounds Semiconductor Quantum–Well Structures", Applied Physics Letters, vol. 60, No. 5, 1992, pp. 586–588.

Suzuki et al, "λ/4–Shifted DFB Laser/Electroabsorption Modulator Integrated Light Source For Multigigabit Transmission", IEEE Transactions on Lightwave Technology, vol. 10, No. 1, (Jan.) 1992, pp. 90–95.

Tan et al, "Systematic Observation Of Strain–Induced Lateral Quantum Confinement In GaAs Quantum Well Wires Prepared By Chemical Dry Etching", Applied Physics Letters, vol. 59, No. 15, Oct. 1991, pp. 1875–1877.

Aoki et al, "Novel Structure MQW Electroabsorption Modulator/DFB Laser Integrated Device Fabricated By Selective Area MOCVD Growth", Electronics Letters, vol. 27, No. 23, Nov. 1991, pp. 2138–2140.

Primary Examiner—Rodney B. Bovernick
Assistant Examiner—Robert McNutt
Attorney, Agent, or Firm—Leydig, Voit & Mayer

[57] ABSTRACT

An integrated semiconductor laser and light modulator includes a semiconductor laser disposed at a first region on a semiconductor substrate, a light modulator of an electric field absorbing type disposed at a second region on the semiconductor substrate adjacent to the first region for outputting a modulated light by transmitting or absorbing the laser light generated in the semiconductor laser, a semiconductor laminated layer structure including a quantum well structure layer disposed in the first region and the second region on the semiconductor substrate, and a lattice mismatched layer having a lattice constant smaller than that of the semiconductor substrate, disposed on a part of the semiconductor laminated layer structure, in the second region. It is possible to enhance the transmission efficiency of the laser light to the light modulator and the quality of the active layer of the semiconductor laser and the light absorption layer of the light modulator. Thus, an integrated semiconductor laser and light modulator that has a high reliability and long lifetime is obtained.

36 Claims, 17 Drawing Sheets

QW1

QW2

QW3

5,539,763

1

SEMICONDUCTOR LASERS AND METHODS FOR FABRICATING SEMICONDUCTOR LASERS

FIELD OF THE INVENTION

The present invention relates to semiconductor lasers and, more particularly, to an integrated semiconductor laser and light modulator that is used as a light source enabling high speed modulation and is monolithically integrated on the same semiconductor substrate. The present invention also relates to a semiconductor laser including a facet window layer having a larger energy band gap than that of the active layer at the light emitting facet. This invention also relates to methods for fabricating these semiconductor lasers.

BACKGROUND OF THE INVENTION

An integrated light source integrating a long wavelength band semiconductor light emitting element (hereinafter referred to as a semiconductor laser) and an electric field absorption type light modulator (hereinafter referred to as a light modulator) on a same semiconductor substrate such as an InP substrate is employed as a signal light source for high speed modulation optical communication.

FIGS. 16(a) and 16(b) are a partially broken perspective view showing an entire structure and a cross-section of a main portion along the resonator length direction, respectively, of a structure of an integrated semiconductor laser and light modulator, recited in Journal of Lightwave Technology, Vol. 8, No. 9, 1990, p. 1357–1362.

In these figures, reference numeral 300a designates a light modulator region, reference numeral 300b designates a semiconductor laser region, and reference numeral 300 designates an n type InP substrate. Reference numeral 302 designates an n type InGaAsP light guiding layer, numeral 303 designates an undoped InGaAsP active layer, and numeral 304 designates an undoped InGaAsP buffer layer, and numeral 305 designates a p type InP layer. Further, reference numeral 306 designates an undoped InGaAsP light absorption layer, numeral 307 designates an undoped InGaAsP buffer layer, and numeral 308 designates a p type InP cladding layer. Numeral 310 designates a diffraction grating. Numeral 311 designates a Fe doped InP current blocking layer. Numeral 312 designates an InGaAs contact layer. Numeral 313 designates a p type impurity diffusion layer. Numeral 314 designates a SiN insulating film, and numeral 315 designates a p side electrode for the light modulator. Numeral 316 designates a p side electrode for the semiconductor laser. Numeral 317 designates an n side electrode common to the semiconductor laser and the light modulator.

Process steps for fabricating the integrated semiconductor laser and light modulator shown in FIG. 16 are illustrated in cross-sections in FIGS. 17(a) to 17(d) and in perspective views in FIG. 17(e) to 17(i).

A description is given of the fabricating process. First of all, as shown in FIG. 17(a), a λ/4 shifted diffraction grating 310 having 240 nm pitch is formed at a region where a semiconductor laser is to be formed on a (100) plane of an n type InP substrate 301 designated by B in the figure, as shown in FIG. 17(a). An n type InGaAsP light guiding layer 302 having a composition corresponding to a wavelength of 1.3 μm and 0.1 μm thick, an undoped InGaAsP active layer 303 having a composition corresponding to a wavelength of 1.57 μm and 0.1 μm thick, an undoped InGaAsP buffer layer 304 having a composition corresponding to a wavelength of

2

1.3 μm and 0.1 μm thick, and a p type InP layer 305 about 1 μm thick, are successively grown in this order by epitaxial growth, and a resist film 320 is formed on the p type InP layer 305 (FIG. 17(b)).

A portion of the resist film 320 on a region where a light modulator is to be formed (designated by A in the figure) is removed by a conventional photolithography technique and, thereafter, a dry etching is performed on the p type InP layer 305, the undoped InGaAsP buffer layer 304, the undoped InGaAsP active layer 303, and the n type InGaAsP light guiding layer 302 employing the resist film as a mask, thereby exposing the surface of the substrate 301 at a region where a light modulator is to be formed (FIG. 17(c)).

An undoped InGaAsP light absorption layer 306 having an energy band gap corresponding to a wavelength of 1.44 μm and 0.3 to 0.5 μm thick, an undoped InGaAsP buffer layer 307 having an energy band gap corresponding to a wavelength of 1.25 μm and 0.1 to 0.3 μm thick, and a p type InP cladding layer 308 about 3 μm thick are successively grown by hydride vapor phase epitaxy (hereinafter referred to as VPE), and then a resist film 321 is formed on the p type InP cladding layer 308 (FIG. 17(d)). Next, the resist film 321 is patterned into a stripe shape along the light guiding direction of the semiconductor laser to be formed by conventional photolithography and, thereafter, a dry etching is performed on the semiconductor layers formed on the substrate 301 employing the patterned resist film 321 as a mask, thereby forming the semiconductor layers into a mesa stripe 325 of 2 micron width. Subsequently, the undoped InGaAsP light absorption layer 306, the undoped InGaAsP buffer layer 307, and the p type InP cladding layer 308 grown on the region for the semiconductor laser are removed by etching and, thereafter, an etching groove 326 for electrical isolation is formed between the region for the light modulator and the region for the semiconductor laser, thereby resulting in a state shown in FIG. 7(e).

A high resistance Fe doped InP current blocking layer 311 is grown by VPE (vapor phase epitaxy) so as to bury both sides of the mesa stripe 325 and the electrically isolating groove 326 and, subsequently, an undoped InGaAs contact layer 312 is grown thereon by VPE (FIG. 17(f)).

Thereafter, a dielectric material film 330 is formed on the contact layer 312, and stripe shaped apertures are formed on this dielectric material film 330 at a region where a light modulator is to be formed and a region where a semiconductor laser is to be formed, respectively. Then, a selective diffusion of zinc is carried out employing the dielectric film as a mask, whereby p type diffusion regions 313 are formed at portions of the Fe doped InP current blocking layer 311 and the undoped InGaAsP contact layer 312, which portions are formed on the mesa stripes 325, so that the diffusion fronts of the p type diffusion regions 313 reach the mesa stripes 325 (FIG. 17(e)).

Thereafter, the InGaAs contact layer 312 is selectively etched so that stripe regions of the contact layer 312 remain at the region for the light modulator and the region for the semiconductor laser, respectively, thereby resulting in a state shown in FIG. 17(h).

A silicon nitride film 314 is deposited covering the upper surfaces of the stripe shaped InGaAs contact layer 312 and the Fe doped InP layer 311, and conventional photolithography and etching are employed to form apertures 314a and 314b for forming electrical contact on the silicon nitride film 314 (FIG. 17(i)).

Thereafter, a metal layer for forming a p side electrode is formed on the silicon nitride film 314 burying the apertures 314a and 314b, and this metal layer is patterned to leave portions burying the apertures 314a and 314b and the peripheral parts thereof and, thereafter, a common n side electrode 317 is formed on the rear surface of the substrate 301, resulting in an integrated semiconductor laser and light modulator, which is formed by monolithically integrating a semiconductor laser and a light modulator on the same substrate shown in FIG. 16(a).

A description is given of the operation. In the prior art optical integrated semiconductor laser, the energy band gap of the undoped InGaAsP light absorption layer 306 in the light modulator portion is larger than the energy band gap of the active layer 303 at the semiconductor laser portion, and the light emitted in the active layer 303 at the semiconductor laser portion in the mesa stripe propagates in the undoped InGaAsP light absorption layer 306 in the light modulator portion and is emitted from the cleavage facet of the undoped InGaAsP light absorption layer 306. In this state, when no voltage is applied to the light modulator (in a state of no bias), the light propagating toward the front facet passes through the light absorption layer 306 and out to outside from the cleavage facet of the light absorption layer 306. Then, because the light absorption layer 306 has an energy band gap larger than the energy band gap of the active layer 303, the laser light passes through the light modulator region without being absorbed. On the other hand, when a reverse bias is applied across the light modulator while applying a positive voltage to the n side electrode 317 and a negative voltage to the p side electrode 315, respectively, an electric field is applied to the light absorption layer 306. Then, due to the Franz-Keldysh effect, the energy band gap of the light absorption layer is substantially reduced as shown in FIG. 19, whereby the propagating light is absorbed by the light absorption layer and not taken out from the facet. In this prior art, a reverse bias is applied across the light modulator as described above, so that an optical signal having a transmission characteristic of, for example, about 5 Gb/s is generated.

In the integrated semiconductor laser and light modulator shown in FIG. 16(a), the light absorption layer 306 at the light modulator region and the active layer 303 at the semiconductor region are different semiconductor layers which have different refractive indices and are formed by separate epitaxial growth processes. Additionally, the layers 306, 307, and 308 of the light modulator are grown thick at the junction portion with the semiconductor laser portion during the epitaxial growth and the active layer 303 at the laser diode region and the light absorption layer 306 at the light modulator region are not connected smoothly. Therefore, reflection and scattering of light may occur at the connection portion between the two layers, which results in a deteriorated optical coupling efficiency between the semiconductor laser and the light modulator.

When carrying out a selective growth employing an insulating film, i.e., covering a part of a wafer surface with an insulating film and carrying out a growth only at a region of the wafer surface not covered with the insulating film, a so-called edge growth occurs in which the growth layer becomes thick in the vicinity of the boundary between a portion covered by the insulating film and a portion not covered by the insulating film. Also in a case where crystal growth is carried out on a wafer having a step, an edge growth occurs in which the layer grown on the concave part at the region for the light modulator becomes thick in the vicinity of the step.

The above-described optical coupling efficiency is significantly influenced by the degree of the edge growth, and the degree of the edge growth due to the step of a wafer becomes larger as the step of the wafer becomes larger. In this prior art, the step of the wafer is equal to or larger than the total thickness of the guide layer 302, the active layer 303, the undoped InGaAsP buffer layer 304, and the p type InP layer 305, i.e., 1.3 μm, and the degree of the edge growth is also fairly large.

In addition, the edge growth not only deteriorates the optical coupling efficiency but produces a large step at the surface after the crystal growth, thereby providing a significant obstacle in the process after the ridge formation.

On the other hand, when semiconductor layers are epitaxially grown by MOCVD with a predetermined region of a semiconductor substrate covered by such as a silicon dioxide film or a silicon nitride film, the material gas which is directly supplied to the surface of the semiconductor substrate is thermally resolved on the substrate and is grown thereon as it is, while the material gas supplied to the insulating film does not react on the insulating film, and, is diffused across the insulating film and moves to a portion where the semiconductor substrate is exposed. It is then thermally resolved on the semiconductor substrate and is epitaxially grown thereon. During this epitaxial growth, there arises a variation in the thickness of the semiconductor layer due to a difference in the growth speed of the semiconductor layer between a position close to and a position spaced from the insulating film on the basis of the above-described effect, and the semiconductor layer grown at a position close to the insulating film becomes thick while the semiconductor layer grown at a position spaced from the insulating film becomes thin. In recent years, utilizing the variation in the thickness of a semiconductor layer when an epitaxial growth is performed by MOCVD in a state where an insulating film is formed on a predetermined region on the substrate, it is proposed to produce an integrated semiconductor laser and light modulator by forming semiconductor layers for a semiconductor laser and semiconductor layers for a light modulator simultaneously in the same epitaxial growth.

FIGS. 18(a), 18(b), and 18(c) are diagrams illustrating a structure and a production method of another prior art semiconductor laser and light modulator produced by the above-described method recited in Electronics Letters, 7th Nov. 1991 Vol. 27 No. 23, p. 2138–2140. In FIG. 18(b), reference characters A and B designate an enlarged views illustrating layer structures of the semiconductor layers in the light modulator region and the semiconductor laser region, respectively.

In these figures, reference numeral 350a designates a semiconductor laser region and reference numeral 350b designates a light modulator region. Numeral 351 designates an n type InP substrate, numeral 352 designates an n type InGaAsP light guiding layer, numeral 353 designates an InGaAs/InGaAsP multi-quantum well layer, numeral 355 designates a p type InP cladding layer, and numeral 356 designates a p type InGaAsP cap layer. In addition, numeral 357 designates a diffraction grating, numeral 358 designates a p side electrode for the light modulator, numeral 359 designates a p side electrode for the semiconductor laser, and numeral 360 designates an n side electrode employed commonly for the light modulator and the semiconductor laser.

A description is given of the process for fabricating the integrated semiconductor laser and light modulator. First of all, as shown in FIG. 18(a), a diffraction grating 357 is formed on the InP substrate 351 at a surface of the region for the semiconductor laser and a stripe shaped silicon dioxide film 370 is formed along the light waveguiding direction of the semiconductor laser on both sides of the diffraction grating 357 (in the figure, a region for producing a light modulator portion is closer). The dimension of the silicon oxide film 370 is, for example, about 200 μm×400 μm, and the distance between the silicon oxide films 370 (the width of the region where the diffraction grating 357 is formed) is about 200 μm.

An n type InGaAsP light guiding layer 352, an InGaAs/InGaAsP multi-quantum well layer 353, and a p type InP cladding layer 355 are successively epitaxially grown on the substrate 351. Then, in the region between the silicon oxide film 370 (that is a region for a semiconductor laser), because the material elements diffuse on the mask, the growth speed becomes higher than the region where no silicon oxide film is present (a region becoming a light modulator). As a result, the thickness of respective layers at the region where the silicon oxide film is provided becomes about 1.5 times to 2 times as thick as in a region where there is no mask. On the other hand, the layer thickness of the well layer 381b of the MQW layer of the semiconductor laser becomes thicker than the thickness of the well layer 381a of the MQW layer of the light modulator, whereby the energy band gap of the MQW layer of the semiconductor laser becomes larger than the energy band gap of MQW layer of the light modulator (FIG. 18(b)).

Thereafter, a p type InGaAsP cap layer 356 is formed on the p type InP cladding layer 355, and a portion of the InGaAsP cap layer between the semiconductor laser portion and the light modulator portion is removed by etching to separate them. A light modulator p side electrode 358 and a laser diode p side electrode 359 are formed on the separated respective cap layers 356, and a common n side electrode 360 is formed on the rear surface of the substrate 352, thereby completing an integrated semiconductor laser and light modulator monolithically integrated on the same substrate (FIG. 18(c)).

A description is given of the operation. The InGaAs/InGaAsP multi-quantum well layer 353 serves as an active layer at the region of the semiconductor laser and as a light absorption layer at the region of the light modulator. When a forward direction bias is applied across the p side electrode and the n side electrode of the semiconductor laser, carriers are injected into the InGaAs/InGaAsP multi-quantum well layer 353 and a laser oscillation occurs at a wavelength in accordance with the effective energy band gap of the MQW layer and the period of the diffraction grating 357. The energy band gap of the MQW layer depends on the thickness of the well layer of the MQW layer, and as the well layer thickness becomes thinner, the energy band gap becomes larger. As already described, during the selective growth by MOCVD, the well layer thickness is larger in the semiconductor laser region than in the light modulator region, and the band gap energy Eg1 of the MQW layer in the DFB laser region is larger than the band gap energy Eg2 of that in the light modulator region. When the light modulator is set in the no bias state and the DFB laser is set in a forward bias state to continuously oscillate, the laser light of wavelength (λ1=1.24/Eg1) is not absorbed at the light modulator region because Eg1<Eg2 and is emitted from the facet. On the other hand, when a reverse bias is applied to the light modulator, due to the Quantum-Confined Stark Effect of an MQW layer, the absorbing edge due to excitons is shifted toward the long wavelength side as shown in FIG. 20 and the effective energy band gap Eg'2 is shorter than the value at the DFB laser region (Eg'2<Eg1), whereby the laser light is absorbed by the light modulator and the light output is turned off.

Accordingly, the laser light can be turned on or off by modulating a voltage applied to the light modulator.

In addition, in an AlGaAs series high output semiconductor laser formed on a GaAs substrate, a lot of surface energy levels are produced at the oscillation facet of the laser. By the influences of the surface energy levels, the vicinity of facet has an equivalent reduction in the energy band gap relative to the laser central portion. Accordingly, the facet vicinity region becomes an absorbing region for the wavelength of the laser light, and the localized heating at the absorbing region increases with an increase in the light output. Since the energy band gap reduces with a temperature rise, absorption of laser light further increases with a temperature rise, presenting positive feedback, thereby finally resulting in melting and destruction. This phenomenon is called as a catastrophic optical damage (hereinafter also referred as COD), being a serious problem in an AlGaAs series high output semiconductor laser. A window structure is formed at a region in the vicinity of the laser oscillation facet as a region having a larger energy band gap than that corresponding to the oscillation wavelength of the laser to reduce the light absorption in the vicinity of the facet, preventing COD.

FIG. 21 is a perspective view illustrating a structure of the vicinity of the laser facet of a high output semiconductor laser having a window structure at the laser oscillation facet, recited in Japanese Journal of Applied Physics, Vol. 30, (1991), 1904–1906. In the figure, reference numeral 401 designates a p type GaAs substrate. Reference numeral 402 designates an n type GaAs current blocking layer, numeral 403 designates a p type $Al_{0.33}Ga_{0.67}As$ cladding layer, numeral 404 designates a p type $Al_{0.08}Ga_{0.92}As$ active layer, numeral 405 designates an n type $Al_{0.33}Ga_{0.67}As$ cladding layer, and numeral 406 designates an n type GaAs contact layer. Reference numeral 407 designates a (101) facet formed by cleavage, and numeral 408 designates an undoped AlGaAs window layer formed on the cleavage facet 407.

A description is given of the fabrication process. First of all, a semiconductor laser structure is produced by a conventional wet etching and an LPE method. In other words, an n type GaAs current blocking layer 402 is epitaxially grown on the p type GaAs substrate 401 and, thereafter, a stripe V-shaped groove reaching the substrate 401 penetrating the current blocking layer 402 is formed at the element central portion by etching. Thereafter, the p type AlGaAs cladding layer 403, the p type AlGaAs active layer 404, the n type GaAs cladding layer 405, and the n type GaAs contact layer 406 are successively grown on the wafer. After the wafer is ground to a desired thickness, it is cleaved into a bar shape of a width corresponding to the resonator length. In a typical high output semiconductor laser, the resonator length is 300 to 600 μm.

A material having an energy band gap larger than that of the laser light is grown on the laser resonator facet 407 produced by cleavage by MOCVD. In this prior art device, the laser oscillation wavelength is 830 nm which corresponds to an energy of about 1.49 eV, and an undoped $Al_{0.4}Ga_{0.6}As$ layer 408 having an energy band gap of about 1.93 eV is employed as a window layer. After electrodes are formed, coating of the window layer facet and chip separation are performed, thereby completing a laser chip.

In the above-described reference, it is reported that adoption of such a window structure suppresses COD, whereby a high output and a lengthy lifetime are obtained.

In the prior art integrated semiconductor laser and light modulator shown in FIG. 18(c), because the active layer of the semiconductor laser and the active layer of the light modulator, i.e., the light absorption layer, are produced from a continuous semiconductor layer which is formed by the same process, the laser light generated in the semiconductor laser can efficiently propagate toward the light modulator side relative to the prior art integrated semiconductor laser and light modulator shown in FIG. 16(c). In the crystal growth method used in the fabrication of the semiconductor laser and light modulator shown in FIG. 18(c), a difference in the layer thickness of the grown semiconductor layers is positively produced between a position close to and a position spaced from the insulating film on the semiconductor substrate utilizing a difference in the quantity of material gas contributing to the epitaxial growth A portion having a larger energy band gap and a portion having a smaller energy band gap in the same semiconductor layers are produced but strict growth conditions are required and the method lacks reproducibility. In addition, since a selective growth utilizing an insulating film is employed for the crystal growth for the active layer of the semiconductor laser and the light absorption layer of the light modulator, which determine the actual device characteristics, the crystal quality may not be so good as compared with the crystal quality in the conventional crystal growth employing no selective mask. In other words, in operating the integrated semiconductor laser and light modulator, favorable device reliability and lifetime are not obtained.

In fabricating the prior art window structure semiconductor laser shown in FIG. 21, there was a problem that a complicated process of cleaving the wafer into a bar shape having a width corresponding to the resonator length of a semiconductor laser and thereafter performing an epitaxial growth was required. Furthermore, in the process of performing epitaxial growth onto the cleavage facet, the quality of crystal growth of the grown semiconductor layer (window layer) significantly depends on the cleaved state and lacks reproducibility.

SUMMARY OF THE INVENTION

It is an object of the present invention to provide an integrated semiconductor laser and light modulator in which an active layer of a semiconductor laser and a light absorption layer of a light modulator can be produced simultaneously by a conventional epitaxial growth, and which is superior in the element reliability and has a lengthy lifetime.

It is another object of the present invention to provide a semiconductor laser which requires no epitaxial growth onto a cleaved facet that lacks in reproducibility and can be fabricated with high reproducibility and easily.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes a semiconductor laser disposed on a first region on a semiconductor substrate, and an light modulator of an electric field absorbing type, which is disposed at a second region on the semiconductor substrate adjacent the first region and outputs a modulated light by transmitting or absorbing the light generated in the semiconductor laser. Further, it includes a semiconductor laminating layer structure including a quantum well structure layer disposed over the first region and the second region on the semiconductor substrate, and a lattice mismatched layer comprising a semiconductor having a lattice constant smaller than that of the semiconductor substrate, which layer is disposed on a part of the semiconductor laminating layer structure at the second region.

According to a second aspect of the present invention, a semiconductor laser device includes a semiconductor laser disposed on a first region of a semiconductor substrate, and a light modulator of an electric field absorbing type which is disposed at a second region on the semiconductor substrate adjacent the first region and outputs a modulated light by transmitting or absorbing the light generated in the semiconductor laser. Further, it includes a semiconductor laminating layer structure including a quantum well structure layer disposed over the first region and the second region on the semiconductor substrate, and a lattice mismatched layer comprising a semiconductor having a lattice constant larger than that of the semiconductor substrate, which is disposed on a part of the semiconductor laminating layer structure at the first region.

According to a third aspect of the present invention, a semiconductor laser device includes a semiconductor laser disposed on a first region of a semiconductor substrate, and a light modulator of an electric field absorbing type which is disposed at a second region on the semiconductor substrate adjacent the first region and outputs a modulated light by transmitting or absorbing the light generated in the semiconductor laser. Further it includes a semiconductor laminating layer structure including a quantum well structure layer disposed over the first region and the second region on the semiconductor substrate, and a lattice mismatched layer produced over the semiconductor laminating layer structure disposed on the first and the second region and comprising a semiconductor having a lattice constant smaller than that of the semiconductor substrate, and the thickness from the upper surface of the well layer producing the quantum well structure to the lower surface of the lattice mismatched layer is t1 at the first region and t2 at the second region, where t1>t2.

According to a fourth aspect of the present invention, a semiconductor laser device includes a semiconductor laser disposed on a first region of a semiconductor substrate, and a light modulator of an electric field absorbing type which is disposed at a second region on the semiconductor substrate adjacent the first region and outputs a modulated light by transmitting or absorbing the light generated in the semiconductor laser. Further, it includes a semiconductor laminating layer structure including a quantum well structure layer disposed over the first region and the second region on the semiconductor substrate, and a lattice mismatched layer produced over the semiconductor laminating layer structure disposed on the first and the second region and comprising a semiconductor having a lattice constant larger than that of the semiconductor substrate, and the thickness from the upper surface of the well layer producing the quantum well structure to the lower surface of the lattice mismatched layer is t1 at the first region and t2 at the second region, where t1<t2.

According to a fifth aspect of the present invention, a method for producing a semiconductor laser device including a semiconductor laser disposed on a first region of a semiconductor substrate and a light modulator of an electric field absorbing type which is disposed at a second region on the semiconductor substrate adjacent the first region and outputs a modulated light by transmitting or absorbing the light generated in the semiconductor laser, includes producing a semiconductor laminated structure including a quantum well structure layer on the first region and the second region on the semiconductor substrate continuously over the two regions, and producing a lattice mismatched layer comprising a semiconductor having a lattice constant smaller than that of the semiconductor substrate on the semiconductor laminated structure formed on the second region.

According to a sixth aspect of the present invention, a method for producing a semiconductor laser device including a semiconductor laser disposed on a first region of a semiconductor substrate and a light modulator of an electric field absorbing type which is disposed at a second region on the semiconductor substrate adjacent the first region and outputs a modulated light by transmitting or absorbing the light generated in the semiconductor laser, includes forming a semiconductor laminated structure including a quantum well structure layer on the first region and the second region on the semiconductor substrate continuously over the two regions, and producing a lattice mismatched layer comprising a semiconductor having a lattice constant larger than that of the semiconductor substrate on the semiconductor laminated structure formed on the second region.

According to a seventh aspect of the present invention, a semiconductor laser includes a semiconductor laminated layer structure including an active layer of a quantum well structure, a lattice mismatched layer comprising a semiconductor having a lattice constant smaller than that of the semiconductor substrate disposed on a prescribed region on the semiconductor laminated layer structure, and a light emitting facet including an active layer portion directly below the region where the lattice mismatched layer is formed.

According to an eighth embodiment of the present invention, a semiconductor laser includes a semiconductor laminated layer structure including an active layer of a quantum well structure, a lattice mismatched layer comprising a semiconductor having a lattice constant larger than that of the semiconductor substrate disposed on a prescribed region of the semiconductor laminated layer structure formed on the second region, and a light emitting facet including an active layer portion directly below the region where the lattice mismatched layer is absent.

According to the present invention, a lattice mismatched layer is disposed above the same quantum well structure epitaxially grown simultaneously to differentiate the energy band gap of the quantum well structure layer at some portion, whereby the active layer of the semiconductor layer and the light absorption layer of the light modulator are produced. Therefore, the active layer of the semiconductor laser and the light absorption layer of the light modulator can be comprised of the same and uniform thickness semiconductor layer, and the transmission efficiency of the laser light produced in the semiconductor laser to the light modulator can be significantly improved relative to the prior art device. In addition, the active layer of the semiconductor laser and the light absorption layer of the light modulator can be formed not by a selective growth or the like but by a conventional one time epitaxial growth process, whereby the quality of the semiconductor layer for the active layer of the semiconductor laser and the light absorption layer of the light modulator that greatly affects the device characteristics, can be made quite superior and an integrated semiconductor laser and light modulator having a high reliability and a lengthy lifetime is produced.

According to a present invention, the energy band gap of the quantum well active layer is differentiated at some portion by arranging a lattice mismatched layer above the quantum well active layer. Therefore, a window structure having a larger energy band gap in the vicinity of the light emitting facet than that of the active layer inside the laser is provided, whereby a complicated process such as epitaxial growth onto the cleaved facet is not required and a semiconductor laser with a window structure can be produced with high reproducibility and with high controllability.

DETAILED DESCRIPTION OF THE PREFERRED EMBODIMENT

Embodiment 1

Figure 1:
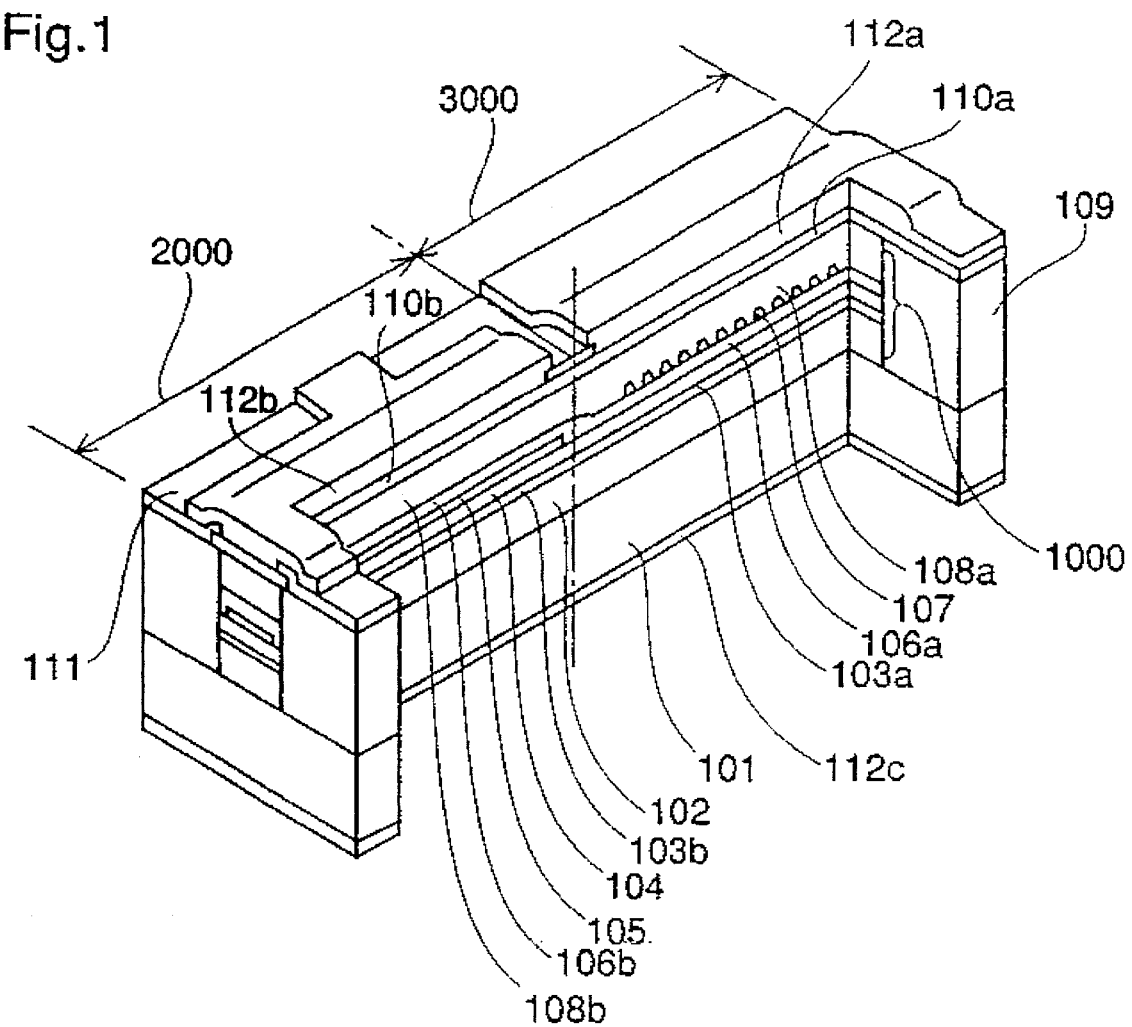
FIG. 1 is a partially sectioned perspective view illustrating a structure of an integrated semiconductor laser and light modulator according to a first embodiment of the present invention.
Figure 2:
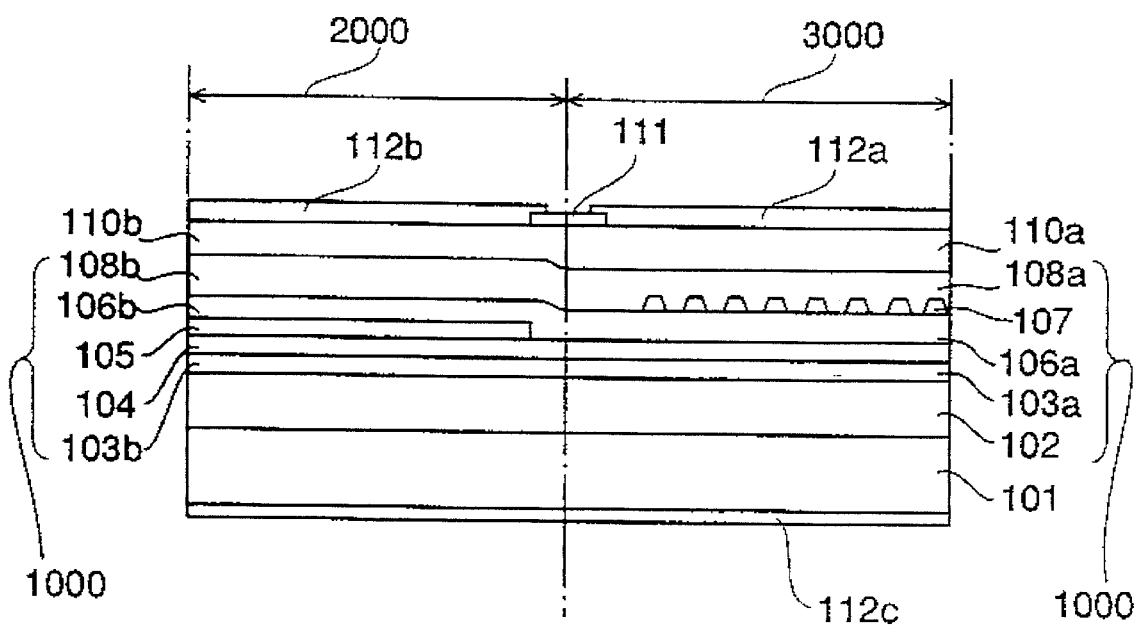
FIG. 2 is a cross-section along the resonator length direction of a main portion of the integrated semiconductor laser and light modulator of FIG. 1.

FIG. 1 is a partially sectioned perspective view illustrating a structure of an integrated semiconductor laser and light modulator according to a first embodiment of the present invention and FIG. 2 is a cross-section along the resonator length direction of a main portion of a semiconductor laser shown in FIG. 1. In the figures, reference numeral 101 designates an n type InP substrate. In the mesa stripe part 1000, an n type InP lower cladding layer 102 is disposed on the n type InP substrate 101, and undoped InGaAs/InGaAsP multi-quantum well layers 103a, 103b are disposed on the n type InP cladding layer 102. A p type InP first upper cladding layer 104 is disposed on the undoped multi-quantum well layers 103a and 103b, and a p type GaInP lattice mismatched layer 105 is disposed on the p type InP upper cladding layer 104 on a predetermined region in a stripe shape for a prescribed length. A p type InP second upper cladding layer 106a is disposed on the p type InP first upper cladding layer 104, a p type InP second upper cladding layer 106b is disposed on the p type GaInP lattice mismatched layer 105. A p type InGaAsP light guiding layer 107 formed as a diffraction grating is disposed on the p type second upper cladding layer 106a, a p type InP cap layer 108a is disposed on the p type second upper cladding layer 106a so as to bury the p type InGaAsP light guide layer 107, and a p type InP cap layer 108b is disposed on the p type InP upper cladding layer 106b. Fe doped InP blocking layers 109 are disposed at both sides of the mesa stripe part 1000. Stripe shaped p type InGaAs contact layers 110a and 110b are disposed on a part of the upper surface of the Fe doped InP blocking layers 109, and the upper surface of mesa stripe part 1000. A silicon nitride film 111 is disposed covering the boundary portion, i.e., connecting portion between the p type InGaAs contact layers 110a and 110b, and the upper surface of the Fe doped InP blocking layers 109. A p side electrode for the semiconductor laser 112a is disposed on the silicon nitride film 111 so that a portion thereof is in contact with the upper surface of the p type InGaAs contact layer 110a, and a p side electrode for the light modulator 112b is disposed on the silicon nitride film 111 so that a portion thereof is in contact with the upper surface of the p type InGaAs contact layer 110b. A common n side electrode 112c is disposed on the rear surface of the n type InP substrate 101.

A portion in the mesa stripe part 1000 not including the p type GaInP lattice mismatched layer 105, i.e., the n type InP lower cladding layer 102, the undoped multi-quantum well layer (active layer) 103a, the p type InP first upper cladding layer 104, the p type InP second upper cladding layer 106a, the p type InGaAsP light guiding layer 107 formed as a diffraction grating, and the p type InP cap layer 108a, is included in a laminated layer structure including an active layer of a semiconductor laser, and the semiconductor laser included in a laminated layer structure, the p type InGaAs contact layer 110a, the p type electrode 112a, and the n type electrode 112c. In addition, a portion in the mesa stripe part 1000 including the p type GaInP lattice mismatched layer 105, i.e., the n type InP lower cladding layer 102, the undoped multi-quantum well layer (light absorption layer) 103b, the p type InP first upper cladding layer 104, the p type GaInP lattice mismatched layer 105, the p type InP second upper cladding layer 106b, and the p type InP cap layer 108b, is included in a laminated layer structure including an active layer of a light modulator, and the light modulator includes in a laminated layer structure, the p type InGaAs contact layer 110b, the p type electrode 112b, and the n type electrode 112c.

FIGS. 3(a)–4(d) are perspective views illustrating process steps for fabricating the integrated semiconductor laser and light modulator of FIG. 1.

Descriptions are given of the fabrication process of the integrated semiconductor laser and light modulator according to the first embodiment of the present invention with reference to the FIGS. 3(a)–4(d), and the internal structure thereof in detail.

Figure 3A:
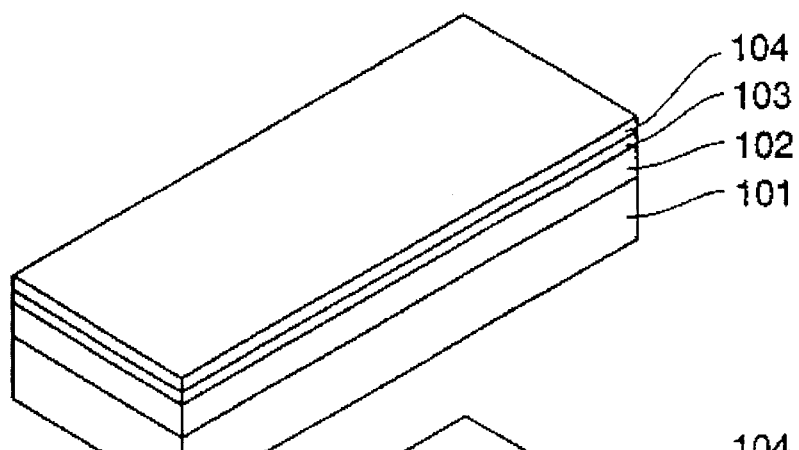
FIGS. 3(a)–3(d) are perspective views illustrating process steps for fabricating the integrated semiconductor laser and light modulator of FIG. 1.

First, as shown in FIG. 3(a), an n type InP lower cladding layer 102 of 2 μm thick, an undoped multi-quantum well active layer 103, and a p type InP first upper cladding layer 104 of 0.03 μm thick are successively epitaxially grown on the n type InP substrate 101 by metal organic chemical vapor deposition (hereinafter referred to as MOCVD). The multi-quantum well layer 103 has a plurality of barrier layers each 7 nm thick comprising InGaAsP having an energy band gap corresponding to a wavelength 1.32 μm and a plurality of InGaAs well layers each of which is 3 nm thick, where the number of the wells is five.

Figure 3B:
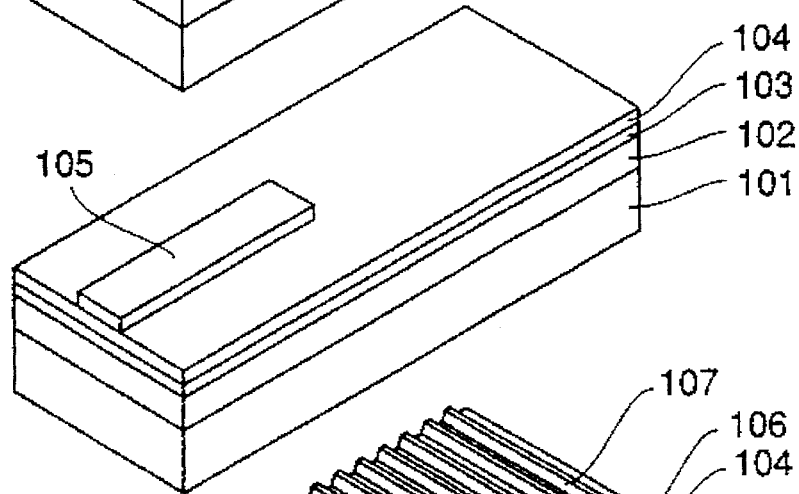

Then, a p type $Ga_{0.37}In_{0.63}P$ lattice mismatched layer 105 of 6 nm thick is epitaxially grown on the p type InP first upper cladding layer 104, and the GaInP lattice mismatched layer 105 is patterned into a stripe shape by employing conventional photolithography and etching as shown in FIG. 3(b). The stripe width of the lattice mismatched layer 105 is about 1.2 μm.

Figure 5A:
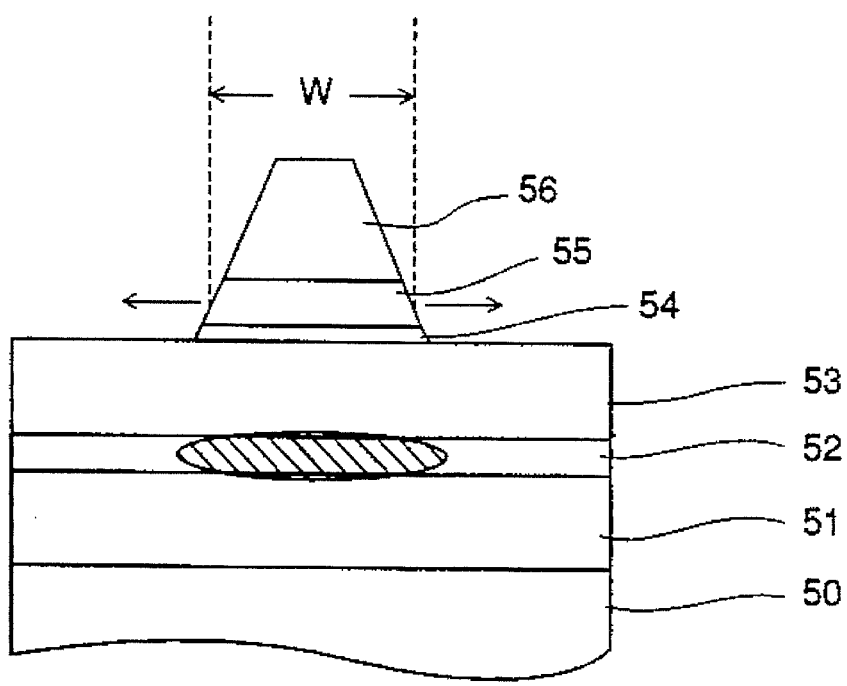
FIGS. 5(a)–5(b) are diagrams for describing a method for partially modulating the energy band gap structure of the quantum well structure by partially disposing a layer not lattice matching the quantum well structure on the quantum well structure, i.e., a diagram illustrating the layer structure of a "stressor" that modulates the energy band gap structure of the quantum well structure directly opposite the lattice mismatched layer and a diagram illustrating the energy band gap structure thereof.
Figure 5B:
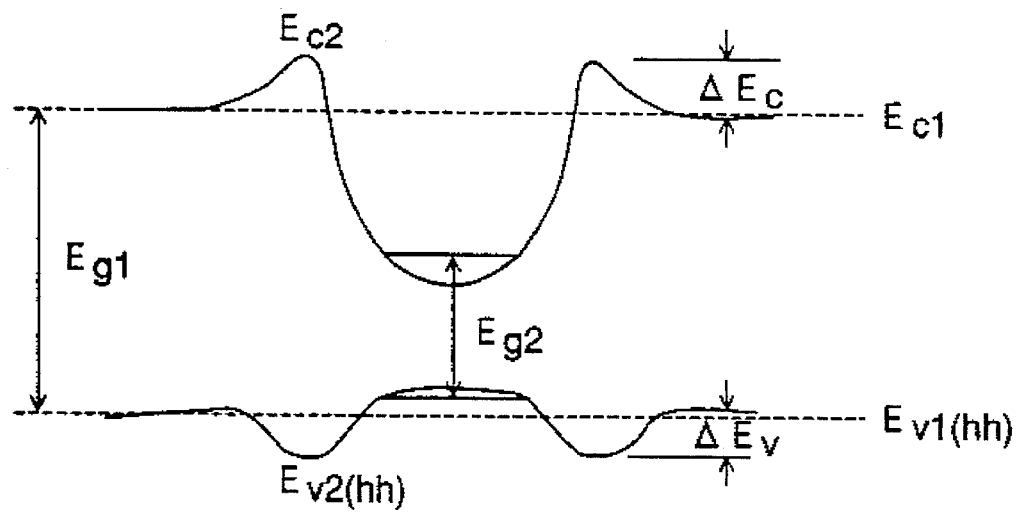

FIG. 5(b) is a diagram for describing the method for partially modulating the energy band structure of the single quantum well layer recited in Appl. Phys. Lett., Vol. 59, No. 15, 7 Oct. 1991, p. 1875–1877.

In FIG. 5(a), reference numeral 50 designates a GaAs substrate. On the substrate 50, an $Al_{0.3}Ga_{0.7}As$ lower cladding layer 51 18 nm thick, a GaAs single quantum well layer 52 6 nm thick, an $Al_{0.3}Ga_{0.7}As$ upper cladding layer 53 18 nm thick, a GaAs layer 54 3 nm thick, an $In_{0.35}Ga_{0.65}As$ lattice mismatched layer 55 6 nm thick, and a GaAs layer 56 20 nm thick are successively epitaxially grown. The GaAs layer 54, the InGaAs lattice mismatched layer 55, and the GaAs layer 56 are formed in a wire configuration having a width W of 120 nm by vapor phase etching. FIG. 5(b) shows an energy band structure of the GaAs single quantum well layer 52 in the layer structure shown in FIG. 5(a).

In this prior art, an InGaAs lattice mismatched layer having a different lattice constant from GaAs is disposed on a GaAs single quantum well layer via the AlGaAs layer, and a stress is applied to the single quantum well layer, whereby the energy band structure of the single quantum well layer is partially modulated. In other words, the lattice constant of $In_{0.35}Ga_{0.65}As$ is larger than that of GaAs by about 2.6%, and a tensile stress is applied to the GaAs single quantum well layer 52 directly above which the lattice mismatched layer 55 is disposed. As a result, in the layer structure shown in FIG. 5(a), the GaAs single quantum well layer 52 forms an energy band edge at a region directly above the quite thin InGaAs lattice mismatched layer 55 that is modulated so that the energy band is decreased. On the contrary, when a semiconductor layer having a smaller lattice constant than that of the well layer is employed, the well layer is subjected to a compressive stress, and the energy band edge of the well layer is modulated so that the energy band gap is increased.

A study to realize a high order quantum confinement in the semiconductor wafer surface was carried out employing such technique, and, for example, in the above-described reference, multiple stripe shaped InGaAs lattice mismatched layers are formed directly on the single quantum well structure. Therefore, a quantum wire structure is produced in the GaAs single quantum well layer. In addition, by forming the lattice mismatched layer in a circular (or rectangular) shape, it is possible to produce a quantum box structure in the quantum well structure.

In this embodiment, the lattice constant of the $Ga_{0.37}In_{0.63}P$ lattice mismatched layer 105 is smaller than that of the InP substrate 101 by about 2.6%, and the multi-quantum well layer 103 directly below the GaInP lattice mismatched layer 105 is subjected to a compressive stress by the GaInP lattice mismatched layer 105. As a result, the energy band structure of the multi-quantum well layer 103 of the region which receives this stress is modulated, and the energy band gap thereof becomes larger than that of the multi-quantum well layer 103 of the region which does not receive the stress.

In this way, the undoped multi-quantum well layer 103 has different band gap energies at a region of the stripe shaped p type GaInP lattice mismatched layer 105 directly above, i.e., the light modulator region, and a region where there is no stripe shaped p type GaInP lattice mismatched layer directly above, i.e., the semiconductor laser region. In the following description, the quantum well layer 103 of the integrated semiconductor laser region is represented as the quantum well active layer 103a, and the quantum well layer 103 of the light modulator region is represented as the quantum well light absorption region 103b.

According to this method, the quantum well layer directly below the lattice mismatched layer is modulated in its energy band gap structure, but as shown in the energy band gap structure of FIG. 5(b), the end part of the lattice mismatched layer produces an energy band gap modulated in the reverse direction due to its edge effect. This edge effect confines electron-hole pairs more effectively to a region having a narrow energy band gap which is produced by applying tensile strain in the quantum well layer and is quite effective in realizing a quantum wire structure or a quantum box structure as in the above-described reference. In this embodiment, however, the energy band gap of the quantum well layer is modulated in the reverse direction, i.e., in the band gap decreasing direction due to this edge effect, so that the light generated in the semiconductor laser region is absorbed at this region, and the light conduction efficiency is deteriorated. Accordingly, it is desirable to suppress the edge effect by any method.

FIGS. 6(a)–6(d) diagrams illustrating a relation between the layer thickness of a layer disposed between the InGaAs lattice mismatched layer and the GaAs single quantum well layer and modulation of an energy band gap structure of the GaAs single quantum well layer, which is recited in GaAs and Related Compounds, Institute of Physics Conference, series No. 129, pp. 217, (1992).

Figure 6A:
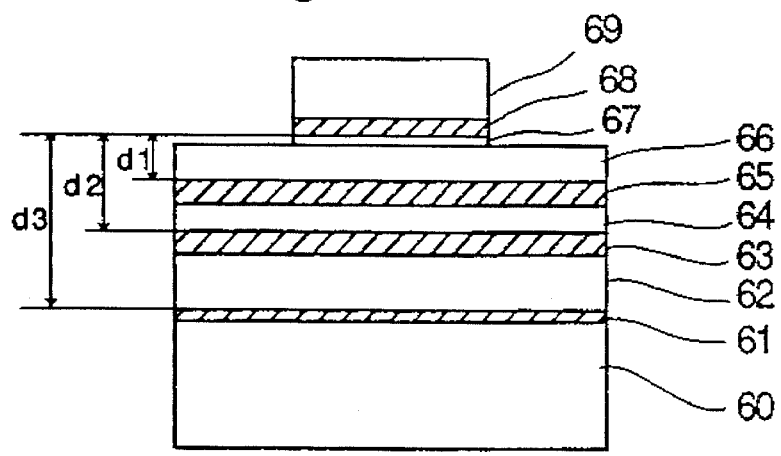
FIG. 6(a) is a cross-section illustrating the layer structure including an InGaAs lattice mismatched layer, the GaAs single quantum well layer, and a layer disposed therebetween

In FIG. 6(a), reference numeral 60 designates an AlGaAs layer. A third GaAs single quantum well layer (QW3) 61 6 nm thick, an AlGaAs layer 62 40 nm thick, a second GaAs single quantum well layer (QW2) 63 7 nm thick, an AlGaAs layer 64 20 nm thick, a first GaAs single quantum well layer (QW1) 65 12 nm thick, and an AlGaAs layer 66 20 nm thick are successively epitaxially grown on the AlGaAs layer 60. A quite thin GaAs layer 67, an InGaAs lattice mismatched layer 68 6 nm thick, and a GaAs cap layer 69 are successively epitaxially grown on the AlGaAs layer 66. The GaAs layer 67, the lattice mismatched layer 68, and the GaAs layer 69 are formed into a dot shape of 120 nm diameter by vapor phase etching.

Figure 6B:
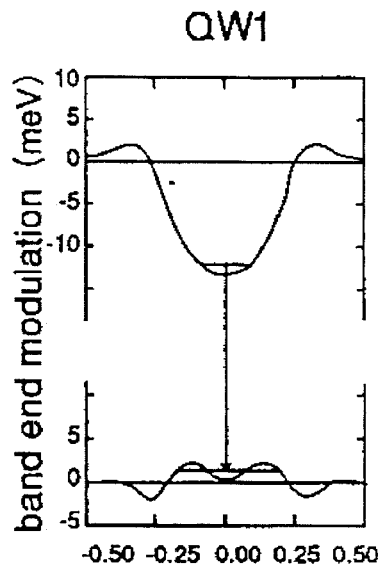
FIGS. 6(b)–6(d) are diagrams showing relations between the layer thickness of the layer disposed between the InGaAs lattice mismatched layer and the GaAs single quantum well layer, and the modulation of the energy band gap structure of the GaAs single quantum well layer.
Figure 6C:
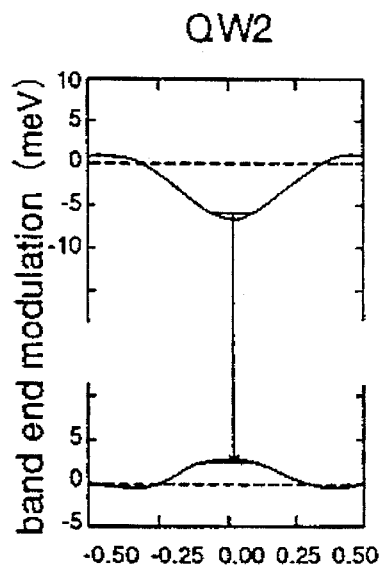
Figure 6D:
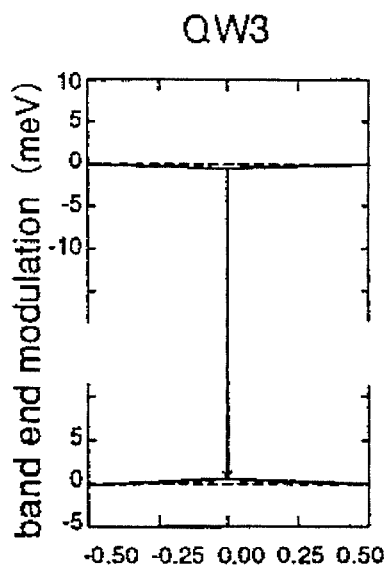

FIG. 6(b) is a diagram illustrating a manner of a band edge modulation of the first GaAs single quantum well layer (QW1) 65, FIG. 6(c) is a diagram illustrating a manner of a band edge modulation of the second GaAs single quantum well layer (QW2) 63, and FIG. 6(c) is a diagram illustrating a manner of a band edge modulation of the third GaAs single quantum well layer (QW3) 61.

The layer thickness $d_1$ of the layer disposed between the first quantum well layer (QW1) 65 and the lattice mismatched layer 68 is about 20 nm, the changed energy of the conduction band which the first quantum well layer (QW1) 65 receives is large, i.e., 13 meV, and the edge effect is large. On the other hand, the layer thickness $d_2$ of the layer disposed between the second quantum well layer (QW2) 63 and the lattice mismatched layer 68 is about 52 nm, the changed energy of the conduction band which the second quantum well layer (QW2) 63 receives is 7 meV, and there is almost no edge effect. In addition, the layer thickness $d_3$ of the layer disposed between the third quantum well layer (QW3) 61 and the lattice mismatched layer 68 is about 99 nm, and the changed energy of the conduction band which the third quantum well layer (QW3) 61 receives is 1 meV.

As is apparent from FIG. 6, if the distance from the quantum well layer is extended to some degree, more concretely, to above 0.03 μm, it is possible to reduce the edge effect to a degree which generates no practical obstruction.

On the other hand, if the distance is made too large, the influence due to the application of stress by the lattice mismatched layer does not reach the quantum well layer, and it is impossible to produce a sufficient energy band gap difference between the absorption layer of the light modulator and the active layer of the semiconductor laser, and a function as an integrated semiconductor laser and light modulator is not obtained. Accordingly, the above-described distance is required to be made less than the distance sufficient for producing an energy band gap difference. In this embodiment, it is desirable to provide an energy gap difference of about 5 meV at the least between the multi-quantum well active layer 103a and the region 103b serving as the multi-quantum well light absorption layer. Assuming that the energy variation of the quantum well layer employing a lattice mismatched layer is approximately inversely proportional to the distance between the lattice mismatched layer and the quantum well layer, the distance between the lattice mismatched layer and the quantum well layer that can produce the energy difference of about 5 meV can be calculated to be about 0.08 μm from the data presented by FIG. 6.

In this embodiment, the thickness of the first upper cladding layer 104 is made 0.03 μm as described above. Therefore, the distance from the upper end of the well layer that is the uppermost among the five well layers constituting the multi-quantum well structure 103 to the lattice mismatched layer is a sum the 0.03 μm thickness of the first upper cladding layer 104 and the 7 nm thickness of the barrier layer between the first upper cladding layer 104 and the well layer disposed at the uppermost position, i.e., 0.037 μm, while the distance from the upper end of the well layer that is the lowermost among the five layers constituting the multi-quantum well structure 103 is a sum of the 0.037 μm and the 40 μm sum of the thickness of the four well layers and four barrier layers, i.e., 0.077 μm thick, so that both of these distances are included in the above-described allowable range.

Figure 3C:
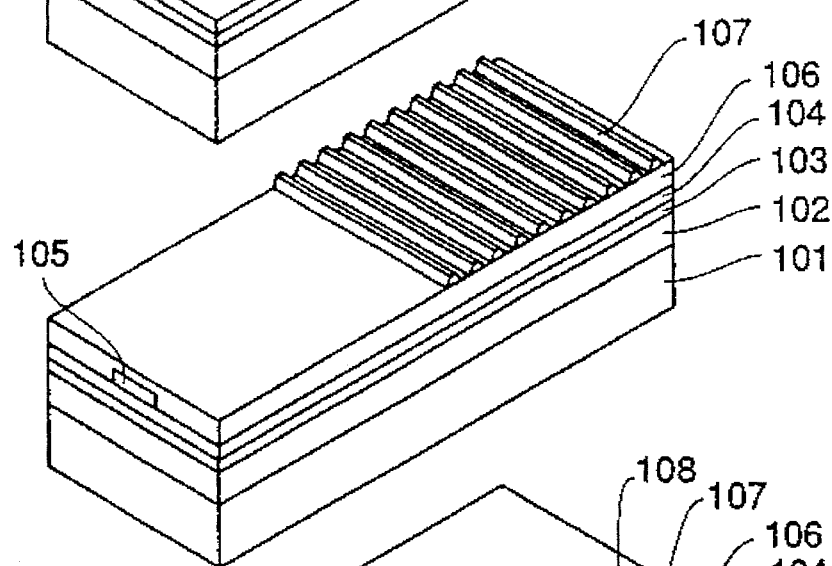

A p type InP second upper cladding layer 106 0.2 μm thick, and a p type light guide layer 107 45 nm thick comprising InGaAsP having an energy band gap corresponding to a wavelength 1.15 μm are successively epitaxially grown on the wafer and, thereafter, the light guide layer 107 is patterned by employing conventional photolithography and etching, thereby producing a diffraction grating having a pitch of 200 nm only at the region where the GaInP lattice mismatched layer 105 is not formed (FIG. 3(c)).

Figure 3D:
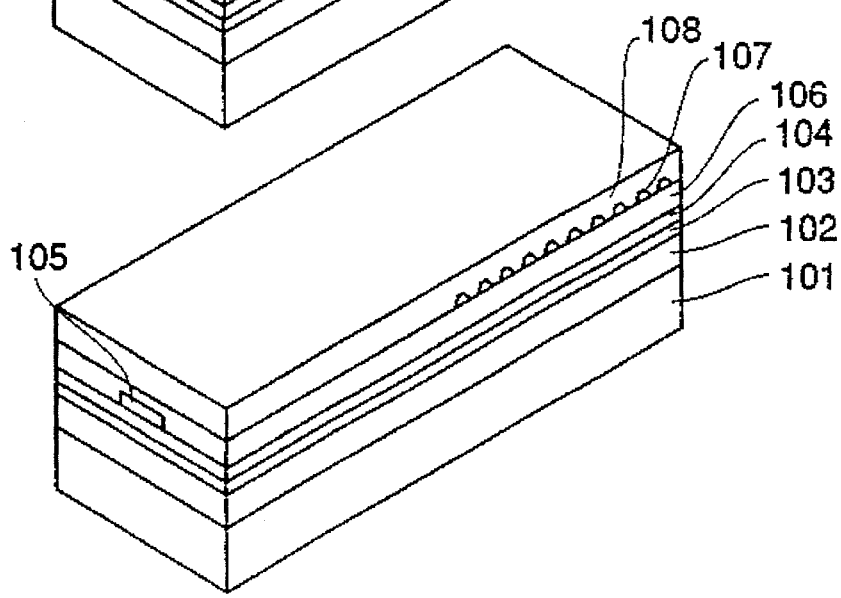

Further, a p type InP cap layer 108 200 nm thick is epitaxially grown on the wafer (FIG. 3(d)).

Figure 4A:
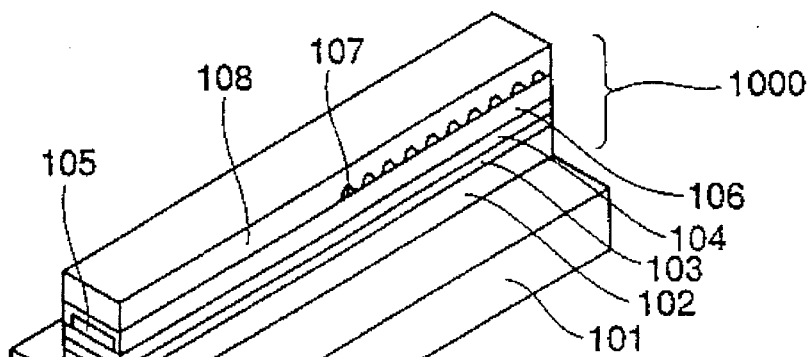
FIGS. 4(a)–4(d) are perspective views illustrating process steps for fabricating the integrated semiconductor laser and light modulator of FIG. 1.

These, the n type InP lower cladding layer 102, the undoped InGaAs/InGaAsP multi-quantum well layer 103, the p type InP upper cladding layer 104, the p type InP upper cladding layer 106, the p type InGaAsP light guide layer 107 formed as a diffraction grating, and the p type InP cap layer 108 are formed by employing conventional photolithography and etching, thereby producing a mesa stripe part 1000 extending in the length direction of the stripe shaped p type GaInP lattice mismatched layer 105 (FIG. 4(a)). The width of the mesa stripe part 1000 is about 1.3 μm. This means that the width of the stripe shaped p type GaInP lattice mismatched layer 105 is a little narrower than the width of the mesa stripe part 1000.

Figure 4B:
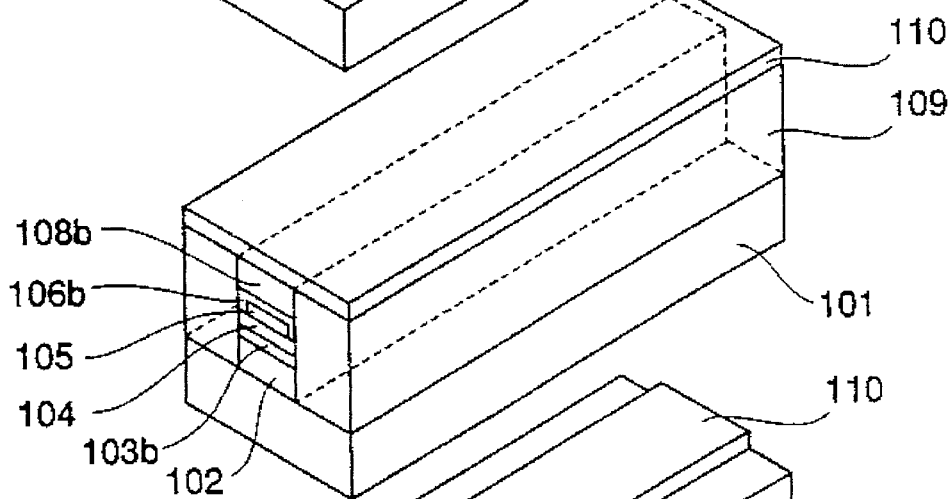
Figure 4C:
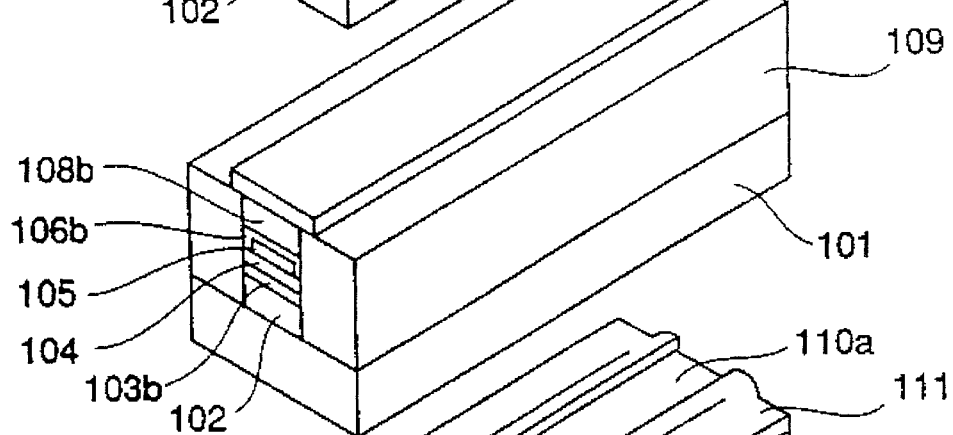
Figure 4D:
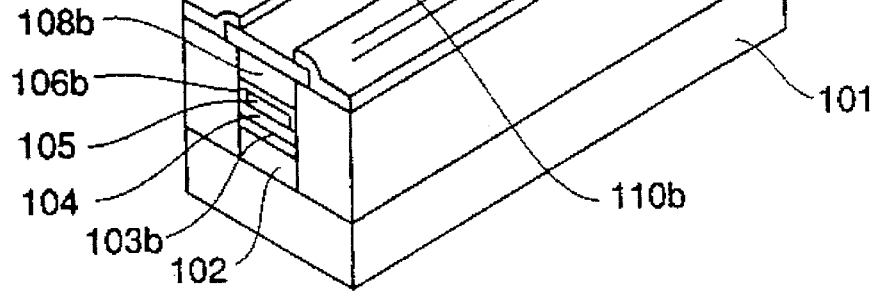

After the mesa stripe part 1000 is formed as described above, Fe doped InP blocking layers 109 are selectively epitaxially grown on both sides of the mesa stripe part 1000 to bury the mesa stripe part 1000 (FIG. 4(b)) and, subsequently, a p type InGaAs contact layer 110 0.5 μm thick is epitaxially grown on the mesa stripe part 1000 and the Fe doped InP blocking layers 109. Next, by employing conventional photolithography and etching, the p type InGaAs contact layer 110 is patterned in a stripe configuration along the mesa stripe part 1000, to form p type InGaAs contact layers 110a and 110b.

A silicon nitride film is disposed on the upper surfaces of the p type InGaAs contact layers 110a, 110b, and the Fe doped InP blocking layers 109 and, thereafter, this film is patterned by conventional photolithography and etching to form a silicon nitride film pattern 111 having openings exposing the surfaces of the p type InGaAs contact layers 110a, 110b, respectively.

Thereafter, a process of forming a metal film by deposition comprising, for example, Au—Zn/Au on the silicon nitride film pattern 111, and patterning the same in a desired configuration to form a p side electrode 112a for a semiconductor laser and a p side electrode 112b for a light modulator separated from each other, and a process of forming a common n side electrode comprising for example Au—Ge/Au on the rear surface of the n type InP substrate 101 are performed to complete the integrated semiconductor laser and light modulator shown in FIG. 1.

A description is given of the operation. When a forward bias is applied across the p side electrode 112a and the n side electrode 112c for the semiconductor laser, carriers are injected into the InGaAs/InGaAsP multi-quantum well active layer 103a, and a laser oscillation occurs at a wavelength in accordance with the effective energy band gap of the multi-quantum well active layer 103a and the diffraction grating produced by the light guide layer 107. The light generated at the multi-quantum well active layer 103a propagates in the light absorption layer 103b in the light modulator side, and the laser light is emitted from the cleaved facet of the multi-quantum well light absorption layer 103b. Then, since the energy band gap of the light absorption layer 103b is larger than that of the active layer 103a as described above, when no voltage is applied to the light modulator part (in a case of no bias), the laser light passes through the light modulator region without being absorbed by the light absorption layer 103b, and it is emitted from the cleaved facet of the light absorption layer 103b. On the other hand, when a reverse bias is applied to the light modulator while applying a plus voltage to the n side electrode 112c and a minus voltage to the p side electrode 112b, an electric field is applied to the light absorption layer 103b, and due to the Quantum-Confined Stark Effect of the multi-quantum well layer, the absorption edge due to the excitons is shifted to the longer wavelength side, whereby the effective energy band gap of the light absorption layer 103b decreases to a value lower than the value in the DFB laser region and the laser light is absorbed and disappears in the light modulator. In this embodiment, by applying a reverse bias to the light modulator as described above, a light signal having transmission characteristics of, for example, 5 Gb/s is generated.

In the integrated semiconductor laser and light modulator of this embodiment, a lattice mismatched layer is partially disposed above the same quantum well structure layer simultaneously epitaxially grown so as to differentiate the energy band gap of the quantum well structure layer partially, whereby the active layer of the semiconductor laser and the light absorption layer of the light modulator can be comprised of the same and, uniform thickness semiconductor layer, and the transmission efficiency of the laser light generated in the semiconductor laser to the light modulator can be increased to a great extent. In addition, since the active layer of the semiconductor laser and the light absorption layer of the light modulator are formed not by employing a selective growth mask or the like but by a conventional first time epitaxial growth process, whereby the quality of the semiconductor layer for the active layer of the semiconductor laser and the light absorption layer of the light modulator that greatly affects the device characteristics, can be made quite superior, and an integrated semiconductor laser and light modulator having a high reliability and a lengthy lifetime is produced.

While in the above-described embodiment the lattice mismatched layer 105 formed into a stripe configuration employing photolithography and etching after it is grown on the entire surface of the first upper cladding layer 104, a stripe shaped lattice mismatched layer may be formed by employing a selective growth technique using an insulating film as a mask. That is, an insulating film is formed on the first upper cladding layer 104, this insulating film is patterned into a configuration having a stripe shaped aperture at a region for the lattice mismatched layer, a lattice mismatched layer is crystalline grown employing the patterned insulating film as a selective growth mask and, thereafter, the insulating film is removed, thereby forming a stripe shaped lattice mismatched layer 105 (FIG. 3(b)).

While in the above-described embodiment a multi-quantum well structure layer is employed as a quantum well structure layer 103, this may be a single quantum well structure layer.

Embodiment 2

Figure 7:
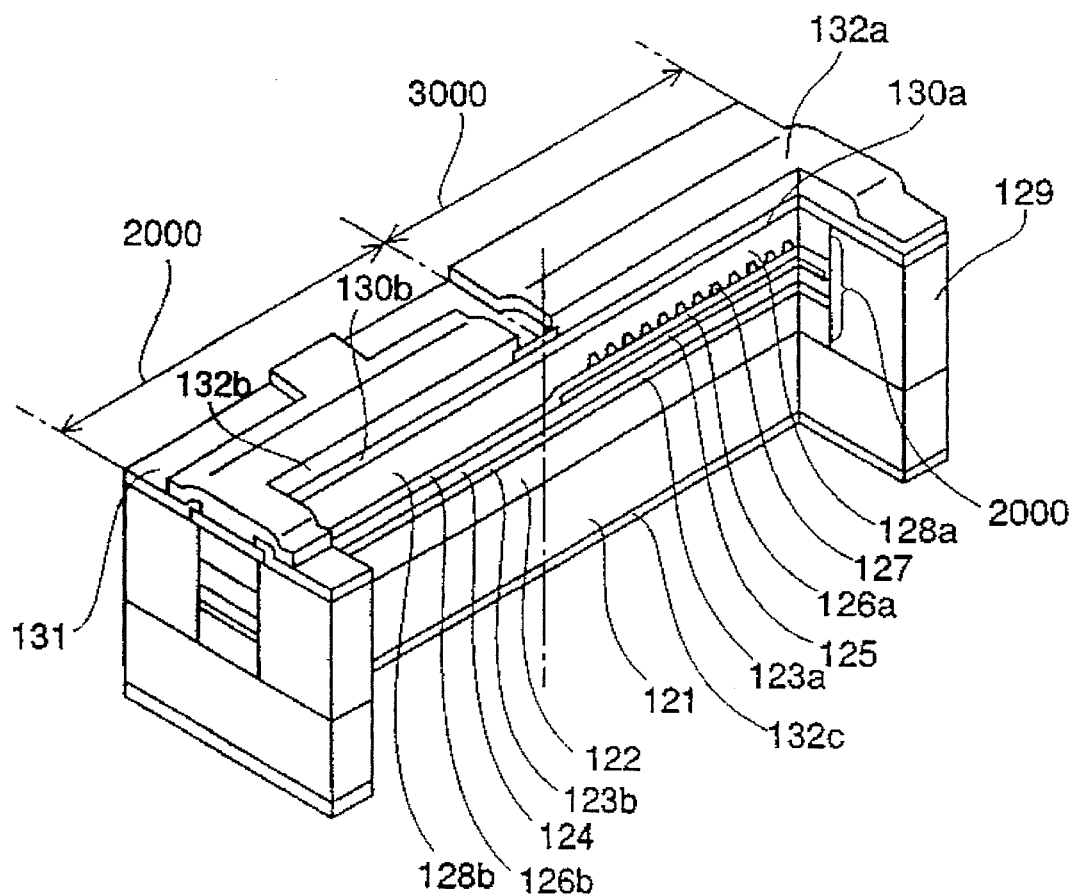
FIG. 7 is a partially sectioned perspective view illustrating a structure of the integrated semiconductor laser and light modulator according to a second embodiment of the present invention.
Figure 8:
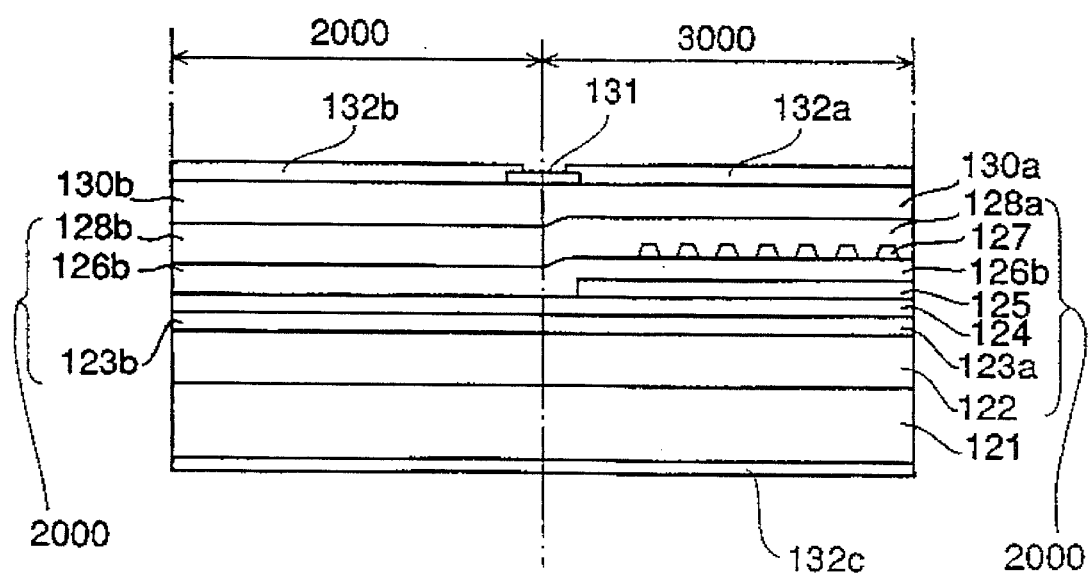
FIG. 8 is a cross-section along the resonator length direction of a main portion of the integrated semiconductor laser and light modulator of FIG. 7.

FIG. 7 is a partially sectioned perspective view illustrating an integrated semiconductor laser and light modulator according to a second embodiment of the present invention and FIG. 8 is a cross-section along the resonator length direction of a main portion of the semiconductor laser shown in FIG. 7. In the figures, reference numeral 121 designates an n type InP substrate. In the mesa stripe part 2000, an n type InP lower cladding layer 122 2 µm thick is disposed on the n type InP substrate 121, and undoped InGaAs/InGaAsP multi-quantum well active layers 123a, 123b are disposed on the n type InP cladding layer 122. The structure of the multi-quantum well is the same as that of the first embodiment. That is, it has a plurality of barrier layers each 7 nm thick comprising InGaAsP having an energy band gap corresponding to the wavelength of 1.32 µm and a plurality of InGaAs well layers each 3 nm thick, where the number of wells is five. A p type InP first upper cladding layer 124 0.03 µm thick is disposed on the undoped multi-quantum well active layers 123a and 123b, a p type $InAs_{0.8}P_{0.2}$ lattice mismatched layer 125 6 nm thick is disposed on the p type InP upper cladding layer 124 on a predetermined region in a stripe shape for a prescribed length. P type InP second upper cladding layers 126a, 126b 0.2 µm thick are respectively disposed on the p type InAsP lattice mismatched layer 125 and on the p type InP first upper cladding layer 124. A p type InGaAsP light guide layer 127 45 nm thick is disposed on the p type InP second upper cladding layer 126a, which is formed in a diffraction grating, and a p type InP cap layer 128a is disposed on the p type InP second upper cladding layer 126a so as to bury the p type InGaAsP light guide layer 127, and a p type InP cap layer 128b is disposed on the p type InP second upper cladding layer 126b. Fe doped InP blocking layers 129 are disposed at the both sides of the mesa stripe part 2000. Stripe shaped p type InGaAs contact layers 130a and 130b 0.5 µm thick are disposed on a portion of the upper surface of the Fe doped InP blocking layer 129 and the upper surface of the mesa stripe part 2000. A silicon nitride film 131 is disposed so as to cover the boundary part (connecting part) between the p type InGaAs contact layers 130a and 130b, and the upper surface of the Fe doped InP blocking layers 129. A p side electrode for semiconductor laser 132a is disposed on the silicon nitride film 131 so that a portion thereof is in contact with the upper surface of the p type InGaAs contact layer 130a, and a p side electrode for light modulator 132b is disposed on the silicon nitride film 131 so that a portion thereof is in contact with the upper surface of the p type InGaAs contact layer 130b. The common n side electrode 132c is disposed at the rear surface of the n type InP substrate 121.

A portion including the p type InAsP lattice mismatched layer 125 in the mesa stripe part 2000, i.e., the n type InP lower cladding layer 122, the undoped multi-quantum well layer (active layer) 123a, the p type InP first upper cladding layer 124, the p type InAsP lattice mismatched layer 125, the p type InP second upper cladding layer 126a, the p type InGaAsP light guide layer 127 formed as the diffraction grating, and the p type InP cap layer 128a, is a laminated layer structure including active layers of a semiconductor laser, and the semiconductor laser includes the laminated layer structure, the p type InGaAs contact layer 130a, the p side electrode 132a, and the n side electrode 132c. In addition, a portion not including the p type InAsP lattice mismatched layer 125 in the mesa stripe part 2000, i.e., the n type InP lower cladding layer 122, the undoped multi-quantum well layer (light absorption layer) 123b, the p type InP first upper cladding layer 124, the p type InP second upper cladding layer 126b, and the p type InP cap layer 128b, is a laminated layer structure including an active layer of a light modulator, and the light modulator includes the laminated layer structure, the p type InGaAs contact layer 130b, the p side electrode 132b, and the n side electrode 132c.

In this embodiment, the lattice constant of the $InAs_{0.8}P_{0.2}$ lattice mismatched layer 125 is larger than that of the InP substrate 121 by about 2.6%, and the multi-quantum well layer 123 direct below the InAsP lattice mismatched layer 125 receives a tensile stress from the InAsP lattice mismatched layer 125. As a result, the energy band structure of the multi-quantum well layer 123 of the region which receives the stress is modulated and the energy band gap thereof becomes smaller than that of the multi-quantum well layer 123 of the region which does not receive the stress. In other words, the energy band gap of the light absorption layer 123b is larger than that of the active layer 123a. Accordingly, when no voltage is applied to the light modulator part (in a case of no bias), the laser light passes through the light modulator region without being absorbed by the light absorption layer 123b, and it is emitted from the cleaved facet of the light absorption layer 123b. On the other hand, when a reverse bias is applied to the light modulator while applying a plus voltage to the n side electrode 132c, and a minus voltage to the p side electrode 132b, an electric field is applied to the light absorption layer 123b, and due to the Quantum-Confined Stark Effect, the absorption edge due to the excitons is shifted to the longer wavelength side, whereby the effective energy band gap of the light absorption layer 123b decreases to a value lower than the value at the laser region, and the laser light is absorbed and disappears in the light modulator.

Also in this second embodiment, similarly as in the first embodiment, a lattice mismatched layer is partially disposed above the same quantum well structure layer simultaneously epitaxially grown so as to differentiate the energy band gap of the quantum well structure layer partially, whereby an active layer of a semiconductor laser and a light absorption layer of a light modulator are produced. Therefore, the active layer of the semiconductor laser and the light absorption layer of the light modulator can be comprised of the same, uniform thickness semiconductor layer, and the transmission efficiency of the laser light generated in the semiconductor laser to the light modulator can be increased to a great extent relative to the prior art device. In addition, similarly to the first embodiment, the active layer of the semiconductor laser and the light absorption layer of the light modulator can be formed not by employing a selective growth mask or the like but by the conventional first time epitaxial growth, whereby the quality of the semiconductor layer for the active layer of the semiconductor laser and the light absorption layer of the light modulator that greatly affects the device characteristics, can be made quite superior, and a device having a high reliability and a lengthy lifetime for long term use can be obtained.

Embodiment 3

Figure 9:
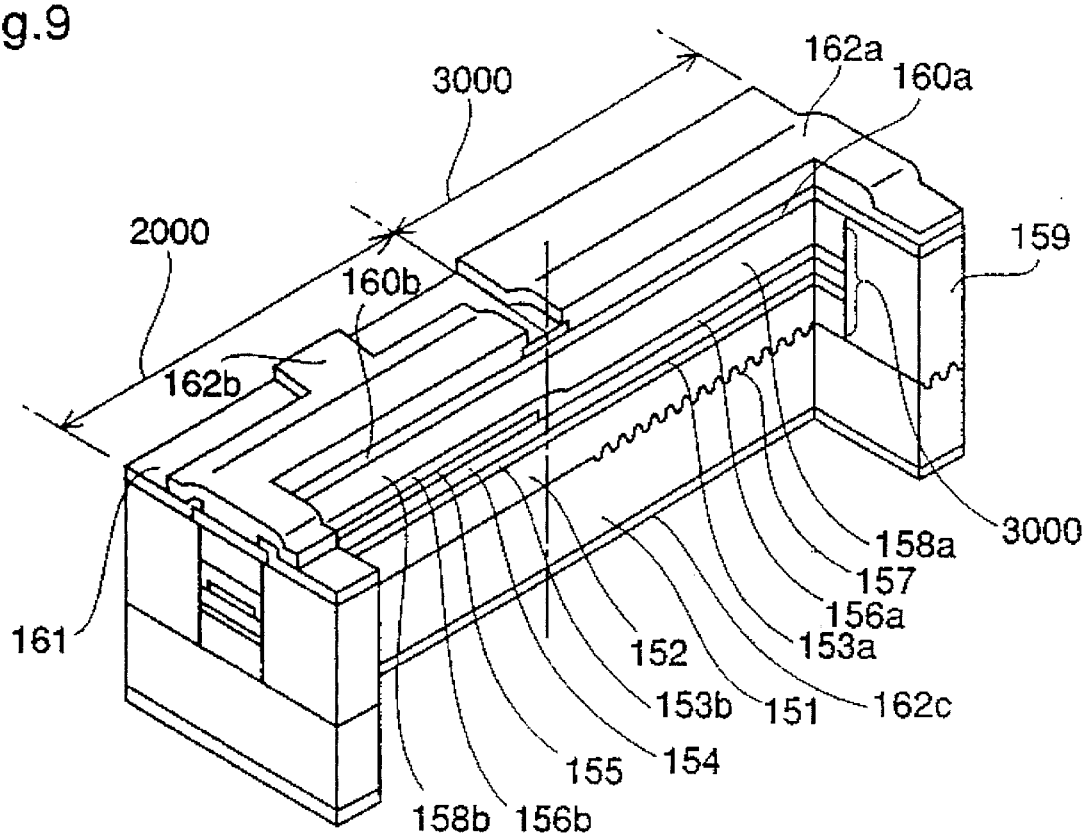
FIG. 9 is a partially sectioned perspective view illustrating a structure of the integrated semiconductor laser and light modulator according to a third embodiment of the present invention.

FIG. 9 is a partially sectioned perspective view illustrating a structure of an integrated semiconductor laser and light modulator according to a third embodiment of the present invention. In the figure, reference numeral 151 designates an n type InP substrate. A diffraction grating 157 is formed on a part of the substrate 151. In the mesa stripe part 3000, an n type InP lower cladding layer 152 is disposed on the n type InP substrate 151, and undoped InGaAs/InGaAsP multi-quantum well layers 153a, 153b are disposed on the n type InP cladding layer 152. A p type InP first upper cladding layer 154 is disposed on the undoped multi-quantum well layers 153a and 153b, and a p type GaInP lattice mismatched layer 155 is disposed on a predetermined region of the p type InP upper cladding layer 154 in a stripe shape for a prescribed length. In addition, a p type InP second upper cladding layer 156a is disposed on the p type InP first upper cladding layer 154, and a p type InP second upper cladding layer 156b is disposed on the p type GaInP lattice mismatched layer 155. A p type InP cap layer 158a is disposed on the p type second upper cladding layer 156a, and a p type InP cap layer 158b is disposed on the p type InP upper cladding layer 156b. Fe doped InP blocking layers 159 are disposed at the both sides of the mesa stripe part 3000.

In addition, on a part of the upper surface of the Fe doped InP blocking layer 159 and on the upper surface of the mesa stripe part 3000, stripe shaped p type InGaAs contact layers 160a and 160b are disposed. A SiN film 161 is disposed so as to cover the boundary portion (connecting portion) of the p type InGaAs contact layers 160a and 160b and the upper surface of the Fe doped InP blocking layers 159. A p side electrode for semiconductor layer 162a is disposed on the SiN film 161 so that a part thereof is in contact with the upper surface of the p type InGaAs contact layer 160a and a p side electrode for light modulator 162b is disposed on the SiN film 161 so that a portion thereof is in contact with the upper surface of the p type InGaAs contact layer 160b. In addition, a common n side electrode 162c is disposed at the rear surface of the n type InP substrate 151.

A portion in the mesa stripe part 3000 not including the p type GaInP lattice mismatched layer 155, that is, the n type InP lower cladding layer 152, the undoped multi-quantum well layer (active layer) 153a, the p type InP first upper cladding layer 154, the p type InP second upper cladding layer 156a, and the p type InP cap layer 158a, is a laminated layer structure including an active layer of a semiconductor laser, and the semiconductor laser includes the laminated layer structure, the p type InGaAs contact layer 160a, the p side electrode 162a, and the n side electrode 162c. Further, a portion in the mesa stripe part 3000 including the p type GaInP lattice mismatched layer 155, that is, the n type InP lower cladding layer 152, the undoped multi-quantum well layer (light absorption layer) 153b, the p type InP first upper cladding layer 154, the p type GaInP lattice mismatched layer 155, the p type InP second upper cladding layer 156b, and the p type InP cap layer 158b, is a laminated structure including an active layer of a light modulator, and the light modulator includes the laminated layer structure, the p type InGaAs contact layer 160b, the p side electrode 162b, and the n side electrode 162c.

In the above-described first embodiment, the light guide layer 107 diffraction grating is provided above the active layer 103a. The diffraction grating 157 may be produced on the surface of the substrate 151 by performing etching, and a diffraction grating may be disposed below the active layer as in this third embodiment and the same effect as described in the first embodiment is obtained.

Embodiment 4

Figure 10:
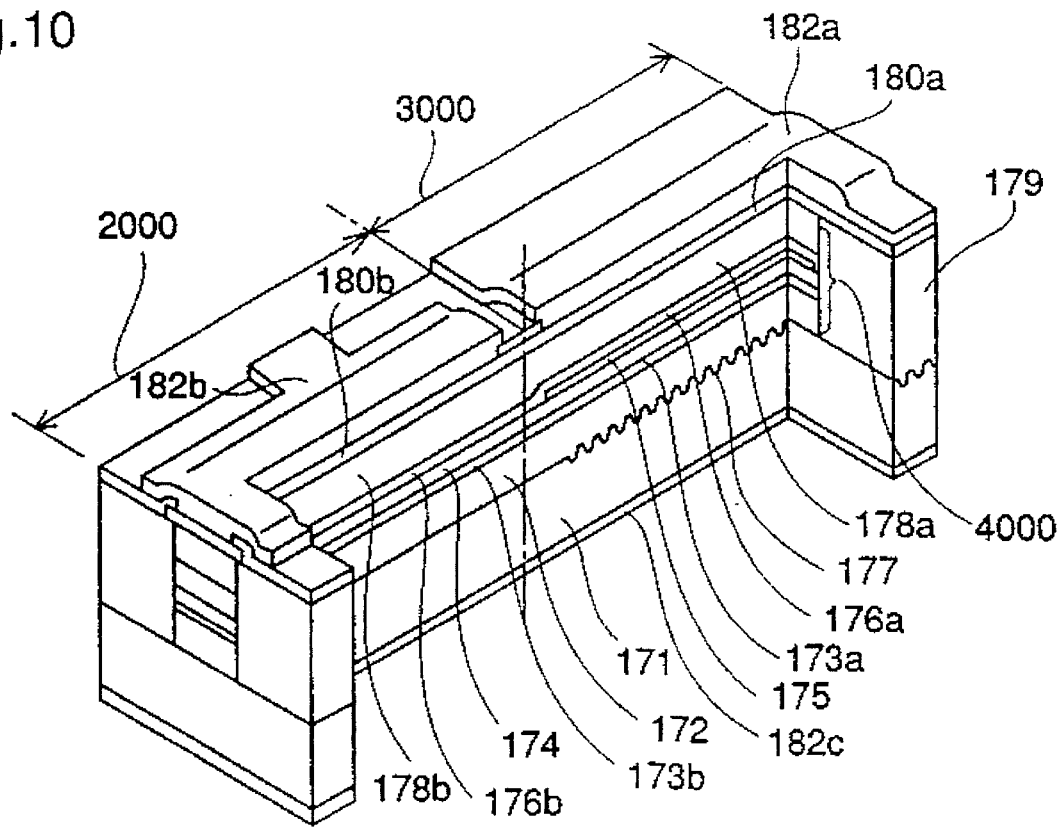
FIG. 10 is a partially sectioned perspective view illustrating a structure of the integrated semiconductor laser and light modulator according to a fourth embodiment of the present invention.

FIG. 10 is a partially sectioned perspective view illustrating a structure of an integrated semiconductor laser and light modulator according to a fourth embodiment of the present invention. In the figure, reference numeral 171 designates an n type InP substrate. A diffraction grating 177 is formed at a portion of the substrate 171. In the mesa stripe part 4000, an n type InP lower cladding layer 172 is disposed on the n type InP substrate 171, and undoped InGaAs/InGaAsP multi-quantum well active layers 173a and 173b are disposed on the n type InP cladding layer 172. A p type InP first upper cladding layer 174 is disposed on the undoped multi-quantum well active layer 173a and 173b, a p type InAsP lattice mismatched layer 175 is disposed at a prescribed region on the p type InP upper cladding layer 174 in a stripe shape for a prescribed length, a p type InP second upper cladding layer 176a is disposed on the p type InAsP lattice mismatched layer 175, and a p type InP second upper cladding layer 176b is disposed on the p type InP first upper cladding layer 174. A p type InP cap layer 178a is disposed on the p type second upper cladding layer 176a, and a p type InP cap layer 178b is disposed on the p type InP upper cladding layer 176b. Fe doped InP blocking layers 179 are disposed at both sides of the mesa stripe part 4000. Stripe shaped p type InGaAs contact layers 180a and 180b are disposed on a part of the upper surface of Fe doped InP blocking layers 179 and the upper surface of the mesa stripe part 4000. A SiN film 181 is disposed so as to cover the boundary portion (connecting portion) of the p type InGaAs contact layers 180a and 180b and the upper surface of the Fe doped InP blocking layers 179. A p side electrode for semiconductor laser 182a is disposed on the SiN film 181 so that a portion thereof is in contact with the upper surface of the p type InGaAs contact layer 180a and a p side electrode for light modulator 182b is disposed on the SiN film 181 so that a portion thereof is in contact with the upper surface of the p type InGaAs contact layer 180b. A common n side electrode is disposed at the rear surface of the n type InP substrate 171.

A portion in the mesa stripe part 4000 including the p type InAsP lattice mismatched layer 175, that is, the n type InP lower cladding layer 172, the undoped multi-quantum well layer (active layer) 173a, the p type InP first upper cladding layer 174, the p type InAsP lattice mismatched layer 175, the p type InP second upper cladding layer 176a, and the p type InP cap layer 178a, is a laminated structure including an active layer of a semiconductor laser, and the semiconductor laser includes the laminated layer structure, the p side InGaAs contact layer 180a, the p side electrode 182a, and the n type electrode 182c. In addition, a portion in the mesa stripe part 4000 not including the p type GaInP lattice mismatched layer 175, that is, the n type InP lower cladding layer 172, the undoped multi-quantum well layer (light absorption layer) 173b, the p type InP first upper cladding layer 174, the p type InP second upper cladding layer 176b, and the p type InP cap layer 178b, is a laminated layer structure including an active layer of a light modulator, and the light modulator includes the laminated layer structure, the p side InGaAs contact layer 180b, the p side electrode 182b, and the n type electrode 182c.

While in the above-described second embodiment, a light guide layer 127 formed in a configuration of a diffraction grating is disposed above the active layer 123a, the diffraction grating 177 may be formed at the surface of the substrate 171 by performing etching and a diffraction grating is disposed below the active layer as in this fourth embodiment and the same effect as described in the second embodiment is obtained.

Embodiment 5

Figure 11:
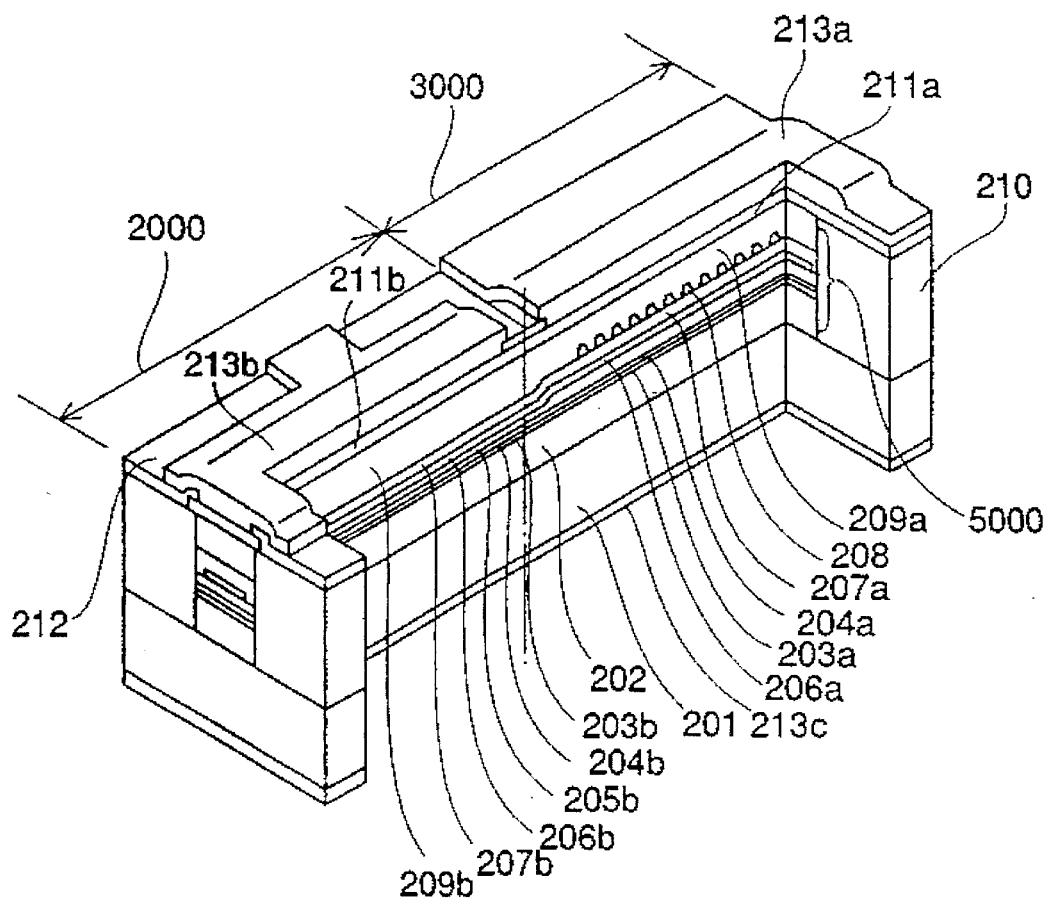
FIG. 11 is a partially sectioned perspective view illustrating a structure of the integrated semiconductor laser and light modulator according to a fifth embodiment of the present invention.
Figure 12:
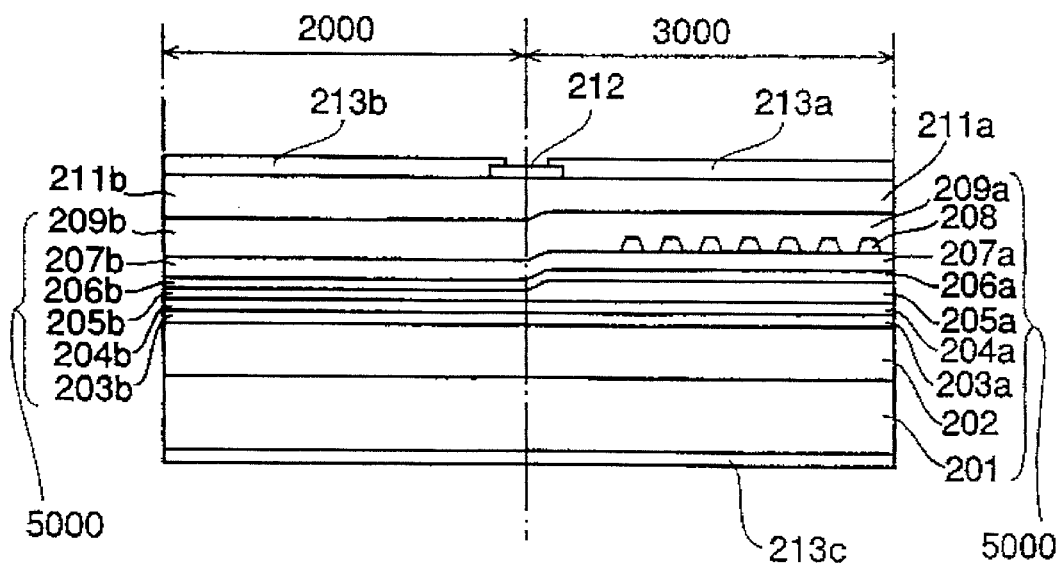
FIG. 12 is a cross-section along the resonator length direction of a main portion of the integrated semiconductor laser and light modulator of FIG. 11.

FIG. 11 is a partially sectioned perspective view illustrating a structure of an integrated semiconductor laser and light modulator according to a fifth embodiment of the present invention, and FIG. 12 is a cross-sectional view illustrating along the resonator length direction of a main portion of the semiconductor laser shown in the figure 11. In the figures, reference numeral 201 designates an n type InP substrate. In the mesa stripe part 5000, an n type InP lower cladding layer 202 is disposed on the n type InP substrate 201, and undoped InGaAs/InGaAsP multi-quantum well structure layers 203a and 203b are disposed on the n type InP lower cladding layer 202. A p type first upper cladding layer 204 is disposed on the undoped InGaAs/InGaAsP multi-quantum well structure layers 203a and 203b. A p type InP second upper cladding layer 205 is disposed on the p type InP first upper cladding layer 204, being thin at a prescribed region 205b and thick at other region 205a. A p type GaInP lattice mismatched layer 206 is disposed on the p type InP second upper cladding layer 205, and a p type InP third upper cladding layer 207 is disposed on the p type GaInP lattice mismatched layer 206. A p type InGaAsP light guide layer 208 formed as a diffraction grating is disposed on the p type InP third upper cladding layer 207a, and a p type InP cap layer 209a is disposed on the p type third upper cladding layer 207a so as to bury the p type InGaAsP light guide layer 208 formed in a diffraction grating, and a p type InP cap layer 209b is disposed on the p type InP third upper cladding layer 207b. Fe doped InP blocking layers 210 are disposed at both sides of the mesa stripe part 5000. Stripe shaped p type InGaAs contact layers 211a and 211b are disposed on a part of the upper surface of the Fe doped InP blocking layers 210 and the upper surface of the mesa stripe part 5000. A SiN film 212 is disposed on the boundary portion (connecting portion) of the p type InGaAs contact layers 211a and 211b and the upper surface of the Fe doped InP blocking layers 210. A p side electrode for semiconductor laser 213a is disposed on the SiN film 212 so that a portion thereof is in contact with the upper surface of the p type InGaAs contact layer 211a and a p side electrode for light modulator 213b is disposed on the SiN film 212 so that a portion thereof is in contact with an upper surface of the p type InGaAs contact layer 211b. The common n side electrode 213c is disposed at the rear surface of n type InP substrate 201.

A portion in the mesa stripe part 5000 including a thick region 205a of the p type InP second upper cladding layer 205, that is, the n type InP lower cladding layer 202, the undoped InGaAs/InGaAsP multi-quantum well active layer 203a, the p type InP first upper cladding layer 204a, the p type InP second upper cladding layer 205a, the p type GaInP lattice mismatched layer 206, the p type InP third upper cladding layer 207a, the p type InGaAsP light guide layer 208 formed as a diffraction grating, and the p type InP cap layer 209a, is a laminated layer structure including an active layer of a semiconductor laser, and the semiconductor laser includes the laminated layer structure, the p side InGaAs contact layer 211a, the p side electrode 213a, and the n type electrode 213c. In addition, a portion in the mesa stripe part 5000 including a thin region 205b of the p type InP second upper cladding layer 205, that is, the n type InP lower cladding layer 202, the undoped InGaAs/InGaAsP multi-quantum well active layer 203b, the p type InP first upper cladding layer 204b, the p type InP second upper cladding layer 205b, the p type GaInP lattice mismatched layer 206, the p type InP third upper cladding layer 207b, and the p type InP cap layer 209b, is a laminated layer structure including an active layer of a light modulator, and the light modulator includes the laminating layer structure, the p type InGaAs contact layer 211b, the p side electrode 213b, and the n side electrode 213c.

FIGS. 13(a)–13(d) are perspective views illustrating a part of the process steps for fabricating the integrated semiconductor laser and light modulator shown in FIG. 11.

Descriptions are given of the fabrication process of the integrated semiconductor laser and light modulator according to this embodiment with reference to FIGS. 13(a)–13(d), and the internal structure thereof in detail.

Figure 13A:
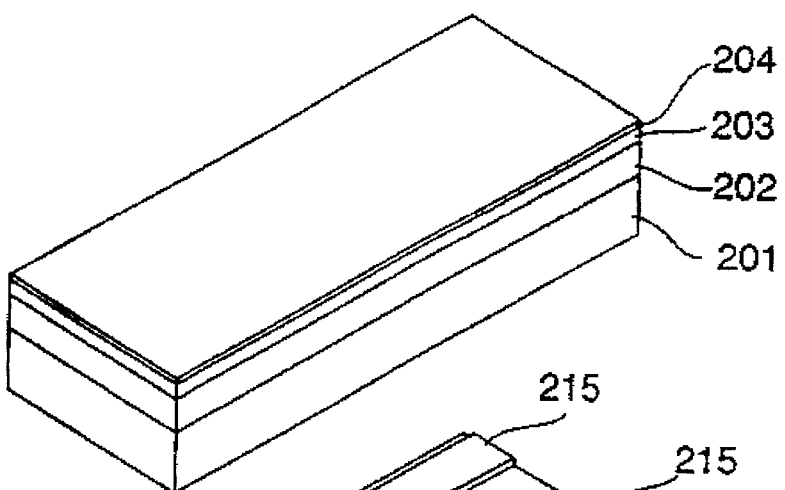
FIGS. 13(a)–13(d) are perspective views illustrating a manufacturing process of the integrated semiconductor laser and light modulator of FIG. 11.
Figure 13B:
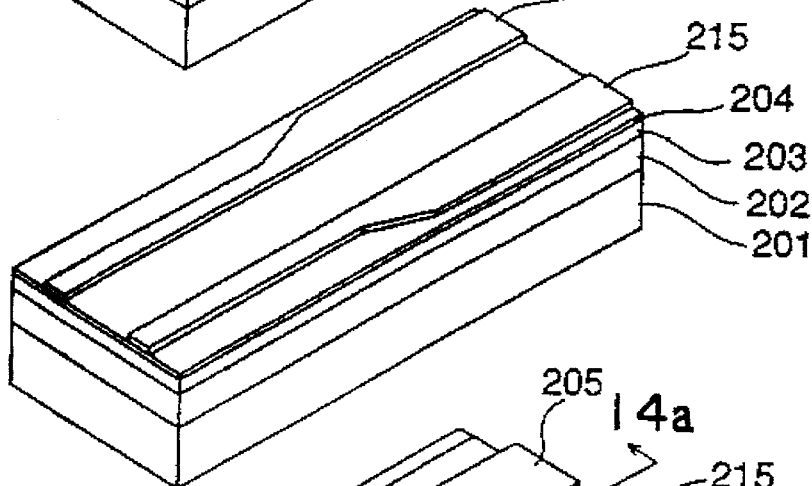
Figure 13C:
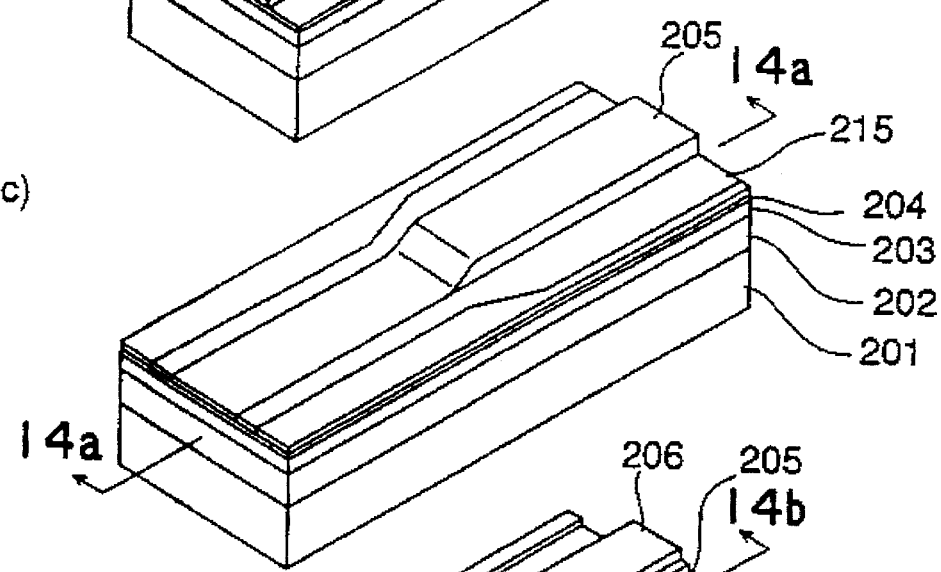
Figure 14A:
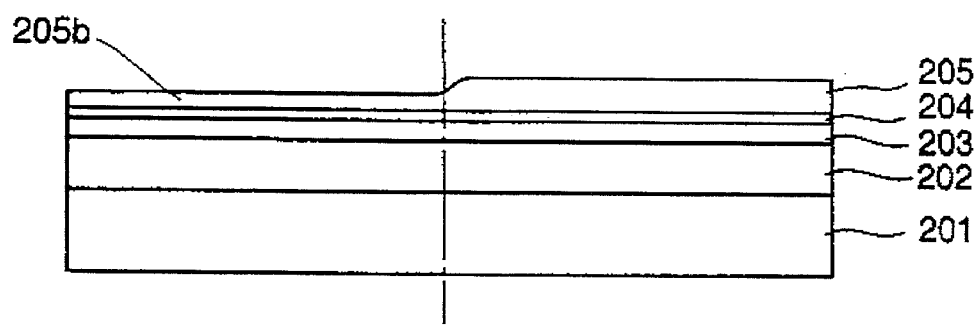
FIGS. 14(a)–14(b) are a perspective view and a cross-sectional view illustrating manufacturing process of the integrated semiconductor laser and light modulator of FIG. 11.

First of all, as shown in FIG. 13(a), the n type InP lower cladding layer 202, the undoped InGaAs/InGaAsP multi-quantum well structure layer 203, and the p type InP first upper cladding layer 204 are successively epitaxially grown on the n type InP substrate 201 by MOCVD or the like. Further, SiO$_2$ film 215 is deposited on the p type InP first upper cladding layer 204, and this SiO$_2$ film 215 is patterned into two stripes having narrower widths at the region for the light modulator than at the region for the semiconductor laser and extending in a stripe shape confronting both sides of the resonator along the resonator length direction of the semiconductor laser and having a predetermined interval by employing conventional photolithography and etching (FIG. 13(b)). As shown in FIG. 13(c), the p type InP second upper cladding layer 205 is epitaxially grown on the first upper cladding layer 204. FIG. 14(a) is a cross section taken along line 14a—14a in FIG. 13(c). As shown in FIG. 14(a), in the region having a wide width of the SiO$_2$ film pattern 215, the p type InP second upper cladding layer 205 has a thicker grown film thickness than that of the region having a narrow width of the SiO$_2$ film pattern 215. In the following description, the p type InP second upper cladding layer having a thicker film thickness is represented as the p type InP second upper cladding layer 205a, and the p type InP second upper cladding layer having a thinner film thickness is represented as the p type InP second upper cladding layer 205b.

Figure 13D:
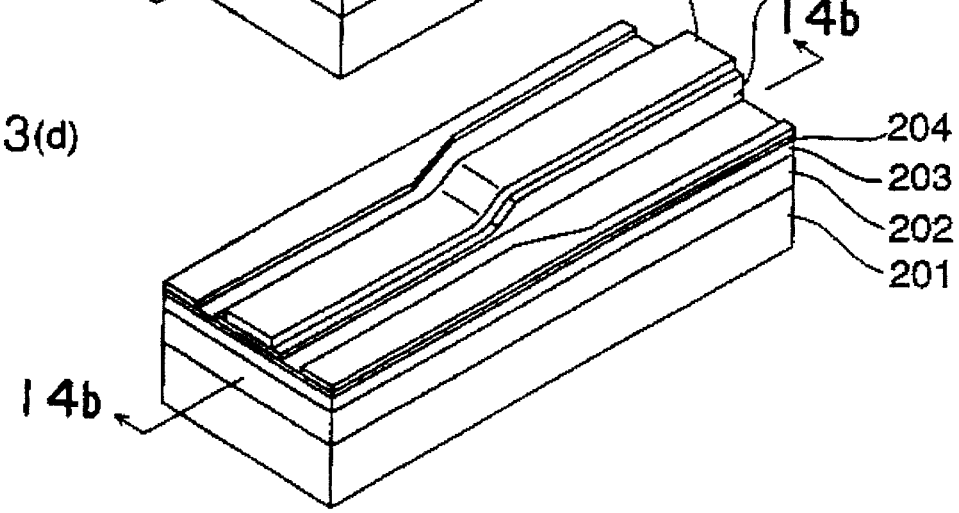
Figure 14B:
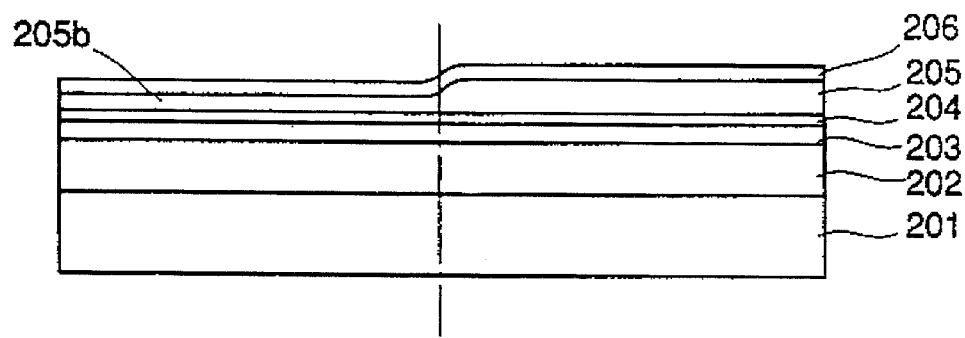

Further, after removing the SiO$_2$ film pattern 215 by etching, the p type GaInP lattice mismatched layer 206 is epitaxially grown, and further the GaInP lattice mismatched layer 206 is patterned to a stripe configuration by employing photolithography and etching (FIG. 13(d)). FIG. 14(b) is a cross section taken along line 14b—14b in FIG. 13(d).

The lattice constant of the GaInP lattice mismatched layer 206 is smaller than that of the InP substrate 201, and the InGaAs/InGaAsP multi-quantum well structure layer 203 directly below the GaInP lattice mismatched layer 206 receives a compressive stress from the GaInP lattice mismatched layer 206, and the energy band gap structure thereof is modulated. In this embodiment, the film thickness of p type InP second upper cladding layer 205 should be set so that the energy band gap of the InGaAs/InGaAsP multi-quantum well structure layer 203 is extended relative to before growing the GaInP lattice mismatched layer 206 in the region for the p type InP second upper cladding layer 205*b* having a thinner layer, while the energy band gap of the InGaAs/InGaAsP multi-quantum well structure layer 203 does not change relative to before growing the GaInP lattice mismatched layer 206 in the region for the p type InP upper second cladding layer 205*a* having a thicker layer. In other words, the grown layer thickness of the p type InP upper second cladding layer 205 is controlled so that in the region for the p type InP upper second cladding layer 205*b* having a thin layer, the distance from the upper end of the well layer disposed at the lowermost of the well layers forming the quantum well structure layer 203 to the lattice mismatched layer 206 is below 0.08 μm while in the region for the p type InP upper second cladding layer 205*a* having a thick layer, the distance from the upper end of the uppermost of the well layers forming the quantum well structure layer 203 is above 0.08 μm. This control can be performed by setting an appropriate width of the SiO$_2$ film pattern 215 in the light modulator region and in the semiconductor laser region.

The fabricating process of the stripe shaped lattice mismatched layer 206 is totally the same as in the processes after FIG. 3(*c*) in the manufacture of the integrated semiconductor laser and light modulator of the first embodiment and the description will be omitted.

In this fifth embodiment, similarly as in the first to the fourth embodiments, a lattice mismatched layer is disposed above the same quantum well structure-layer simultaneously epitaxially grown so as to differentiate the energy band gap of the quantum well structure layer partially, whereby the active layer of the semiconductor laser and the light absorption layer of the light modulator are formed. Therefore, the active layer of the semiconductor laser and the light absorption layer of the light modulator are the same and uniform thickness semiconductor layer, and the transmission efficiency of the laser light generated in the semiconductor laser to the light modulator can be increased to a great extent relative to the prior art device. In addition, the active layer of the semiconductor laser and the light absorption layer of the light modulator are formed not by employing a selective growth mask or the like but by the conventional first time epitaxial growth, whereby the quality of the semiconductor layer for the active layer of the semiconductor laser and the light absorption layer of the light modulator that greatly affects the device characteristics, can be made quite superior, and a device having a high reliability and a lengthy lifetime for long term use can be obtained.

While in the above-described first to the fourth embodiments, the lattice mismatched layer is disposed partially in the resonator length direction and therefore an edge effect slightly occurs at the end portion in the resonator length direction of the lattice mismatched layer, whereby a region where the energy band gap is narrowed may be formed at the interface between the active layer of the semiconductor laser and the light absorption layer of the light modulator. In this fifth embodiment, however, since the lattice mismatched layer is formed continuously with both of the semiconductor laser and the light modulator, not formed partially in the resonator length direction as in the above-described first to the fourth embodiments, a region where the energy band gap is narrowed is not formed at the interface between the active layer of the semiconductor laser and the light absorption layer of the light modulator.

While in the above-described fifth embodiment, the layer thickness of the second upper cladding layer 205 is thick at the region for the semiconductor laser and thin at the region for the light modulator, and a layer comprising InGaP having a smaller lattice constant than that of InP is employed as a lattice mismatched layer, the layer thickness of the second upper cladding layer may be thin at the region for the semiconductor laser and thick at the region for the light modulator, and the layer comprising InAsP or the like having a larger lattice constant than that of InP may be employed as the lattice mismatched layer.

Further, while in the above-described fifth embodiment, the lattice mismatched layer 206 is formed in a stripe configuration after being grown on the entire surface of the wafer by employing photolithography and etching, an insulating film pattern in a configuration having an aperture at the region for the lattice mismatched layer is formed on the entire surface of the wafer, and a stripe shaped lattice mismatched layer is formed employing a selective growth technique employing the insulating film as a mask.

In the above-described embodiment a multi-quantum well structure layer is employed as the quantum well structure layer 203; however, this may be a single quantum well structure layer.

Embodiment 6

Figure 15A:
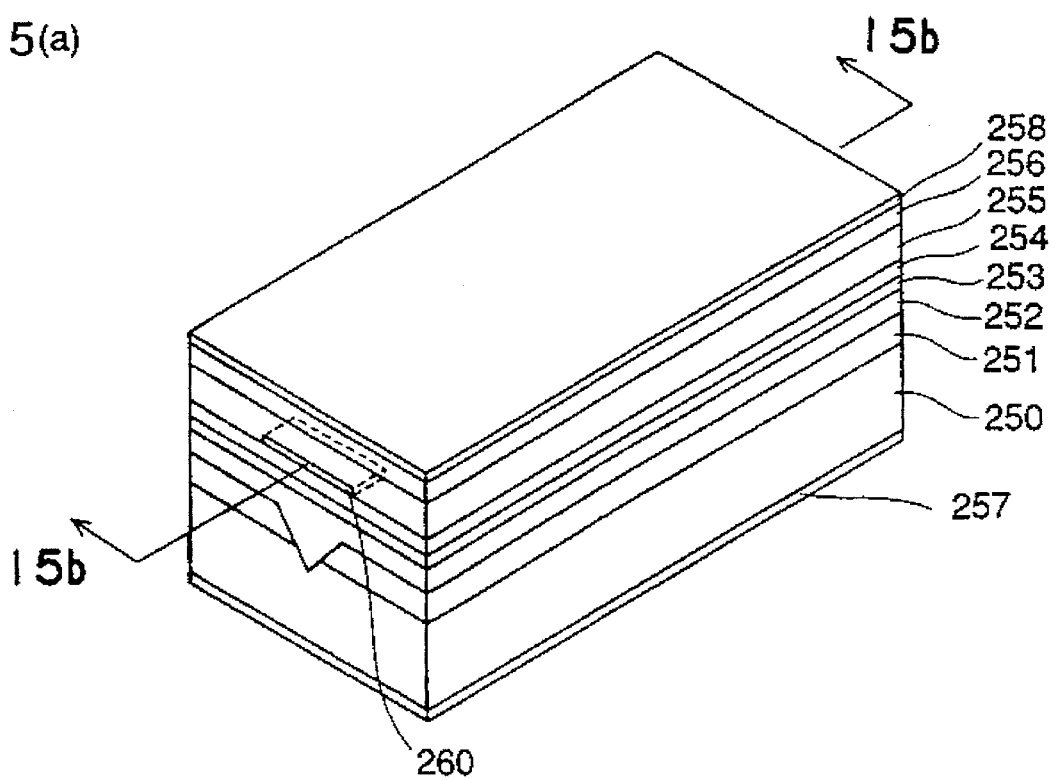
FIG. 15(a) is a perspective view illustrating a structure of a facet window structure semiconductor laser according to a sixth embodiment of the present invention.
Figure 15B:
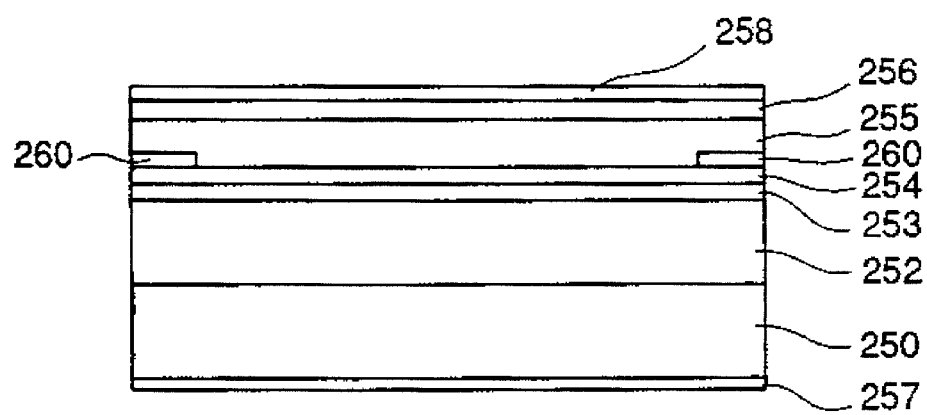
FIG. 15(b) is a cross-sectional view thereof along the resonator length direction.
Figure 16A:
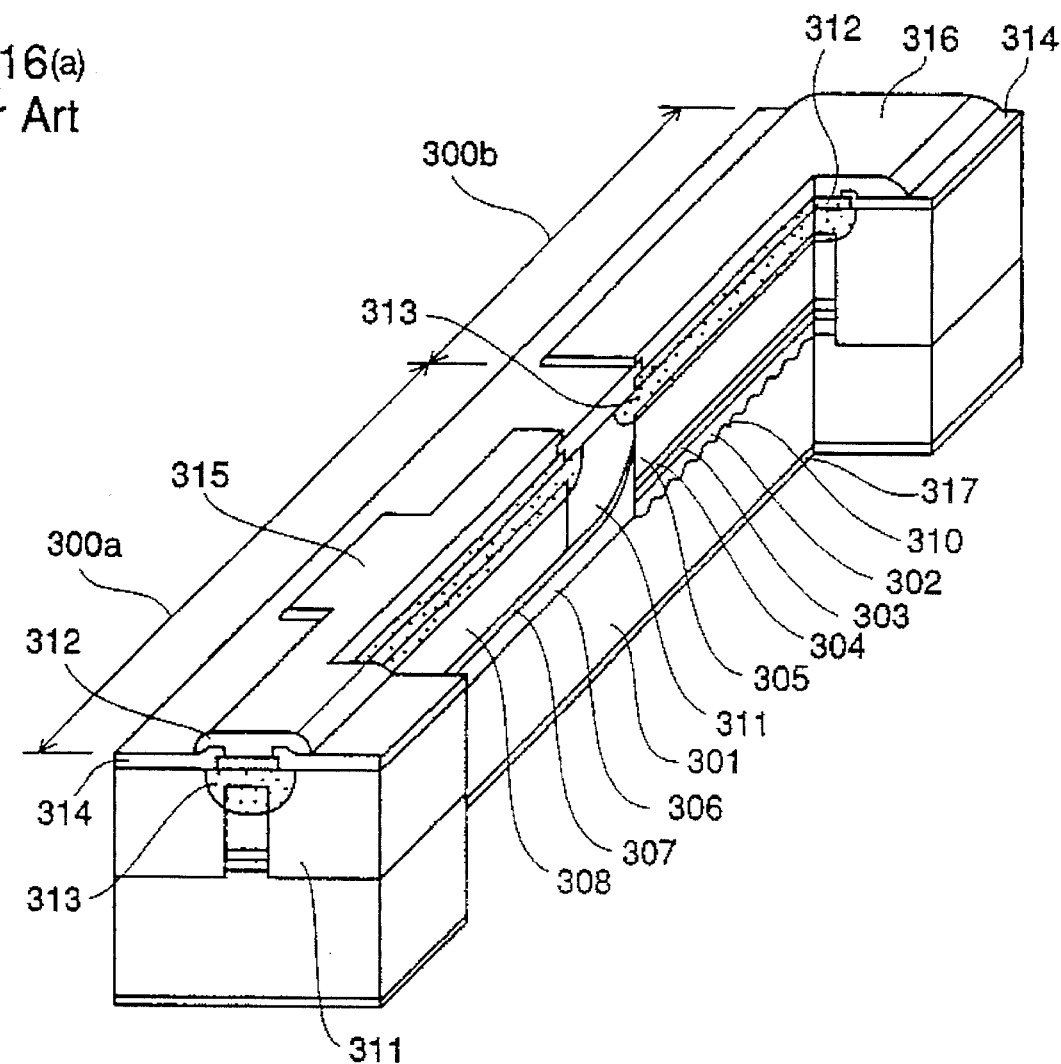
FIG. 16(a) is a partially sectioned perspective view illustrating a structure of a facet window structure of a semiconductor laser according to a sixth embodiment of the present invention.
Figure 16B:
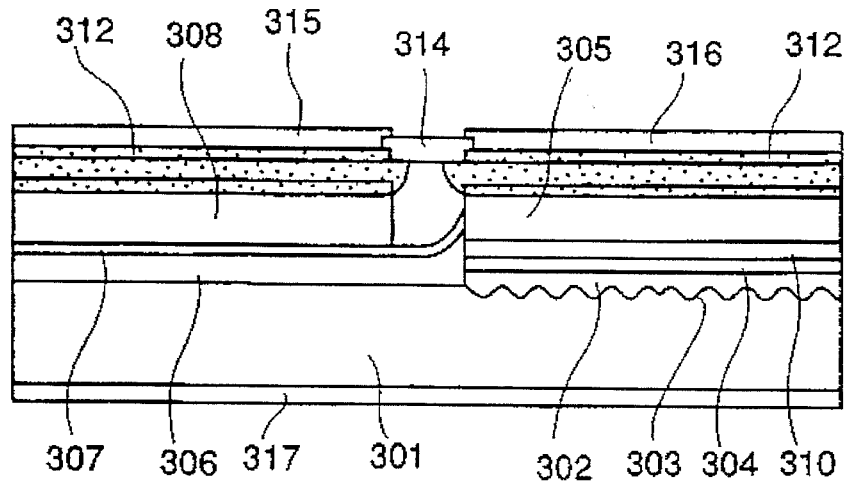
FIG. 16(b) is a cross-sectional view of a main portion thereof along the resonator length direction.
Figure 17A:
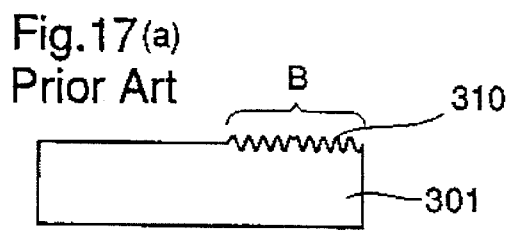
FIGS. 17(a)–17(d) are cross-sectional views and FIGS. 17(e)–17(i) are perspective views respectively illustrating the process steps for fabricating the integrated semiconductor laser and light modulator of FIG. 16(a).
Figure 17B:
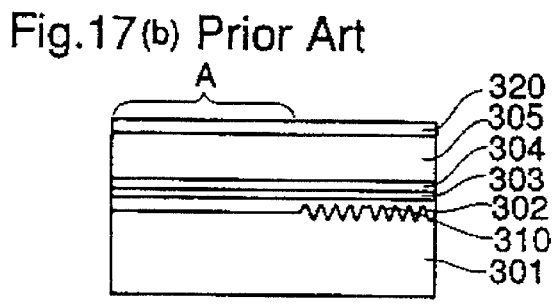
Figure 17C:
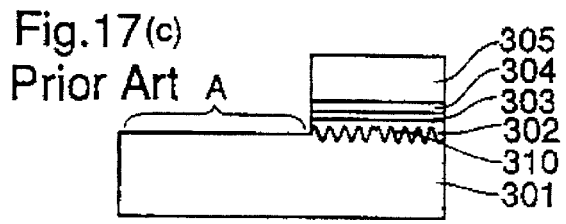
Figure 17D:
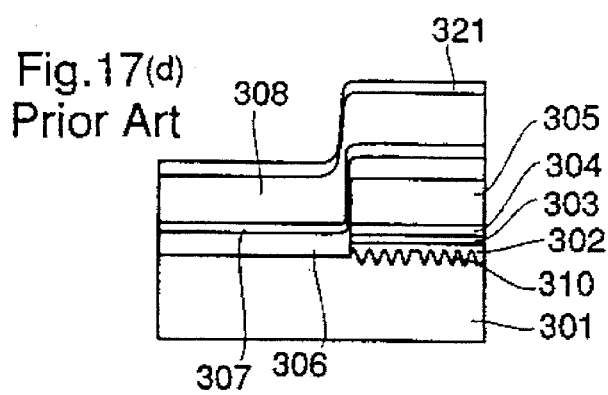
Figure 17E:
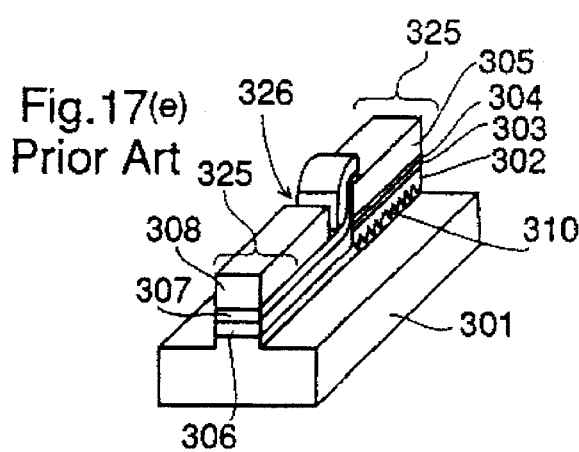
Figure 17F:
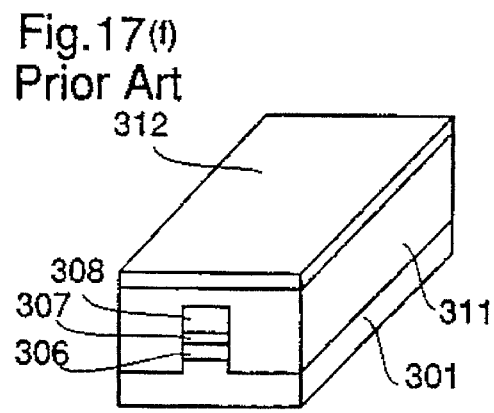
Figure 17G:
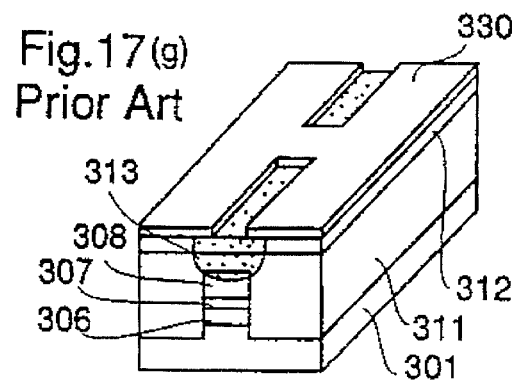
Figure 17H:
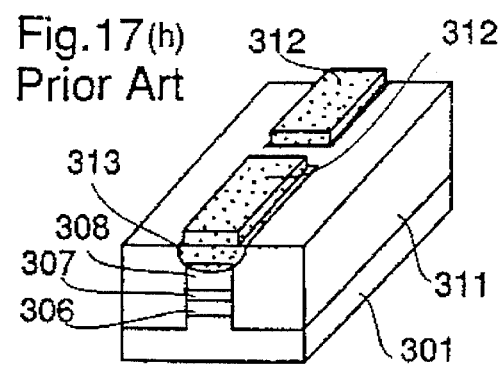
Figure 17I:
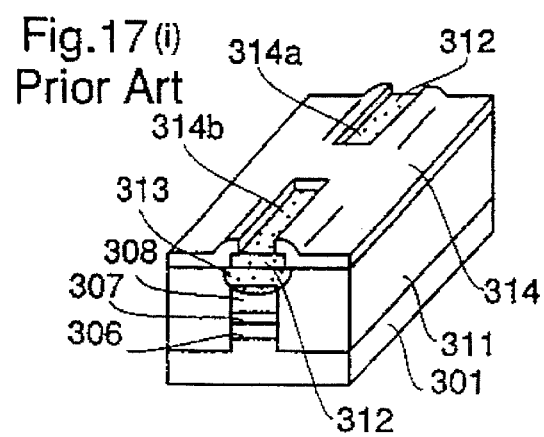
Figure 18A:
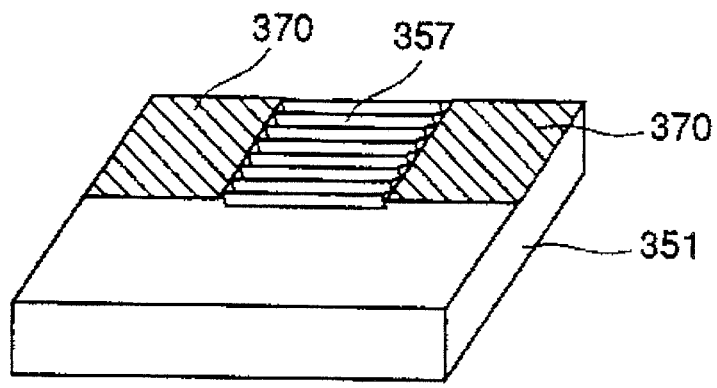
FIGS. 18(a), 18(b), and 18(c) are perspective views and a cross-sectional view for describing a structure and a fabrication process of another prior art integrated semiconductor laser and light modulator.
Figure 18B:
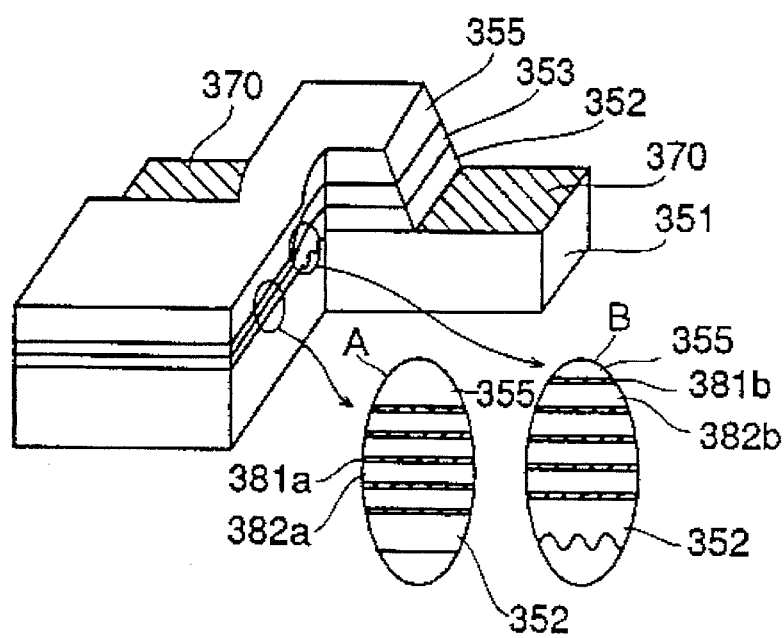
Figure 18C:
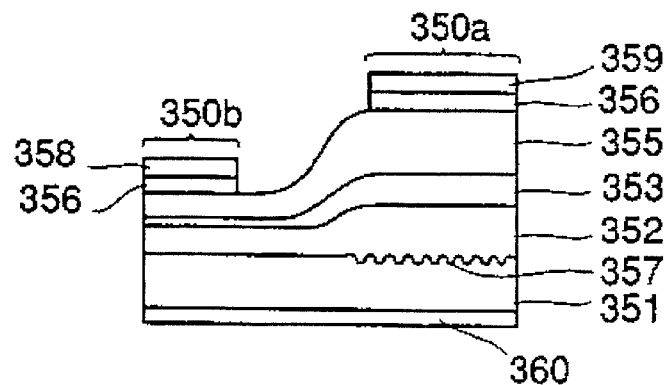
Figure 19:
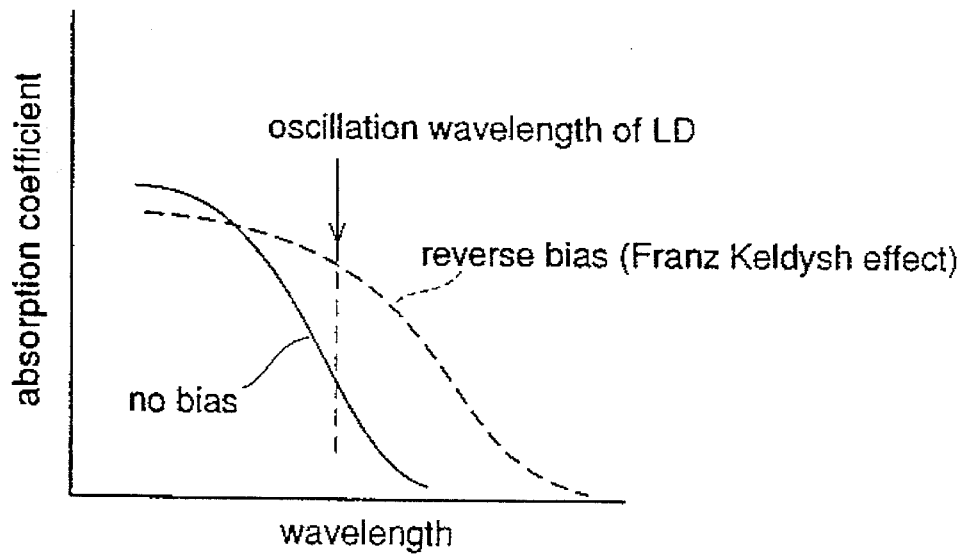
FIG. 19 is a diagram for describing modulation of laser light due to the Franz-Keldysh effect.
Figure 20:
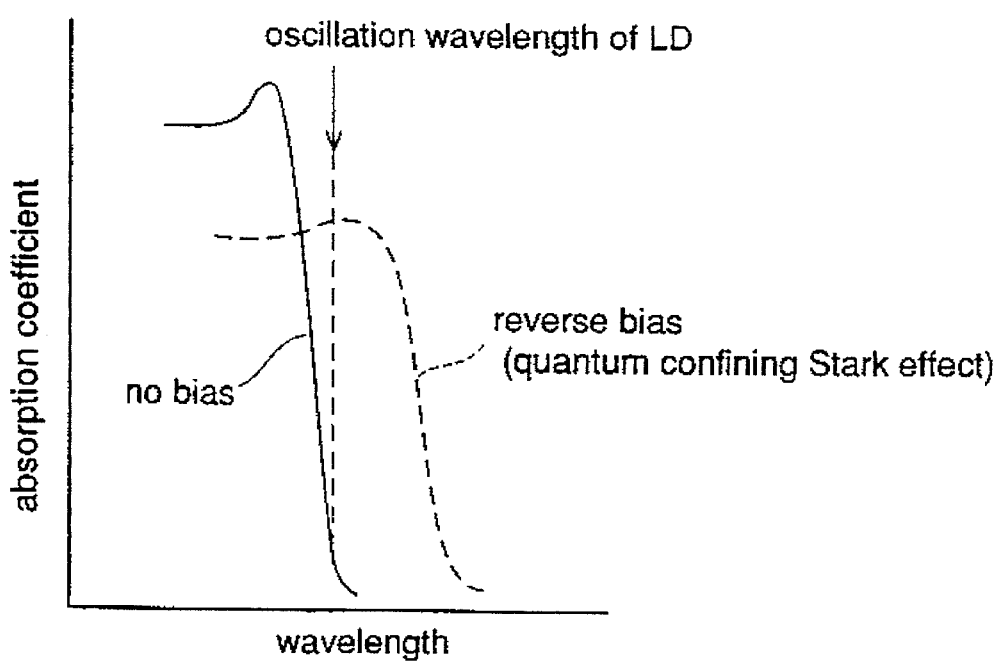
FIG. 20 is a diagram for describing modulation of laser light due to quantum confinement Stark effect.
Figure 21:
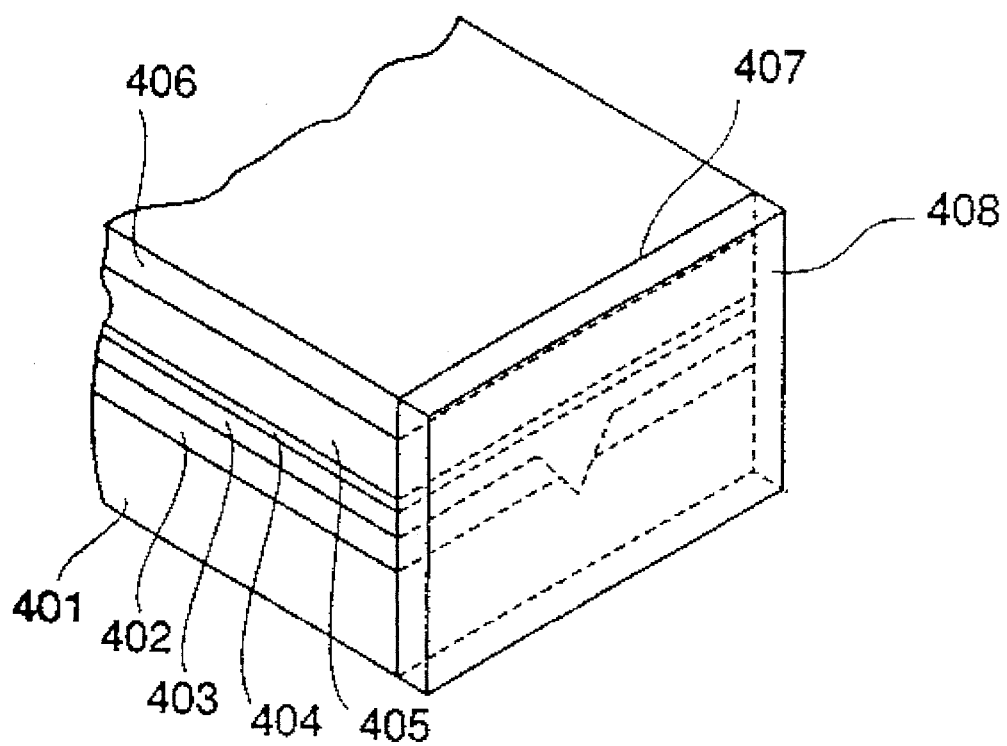
FIG. 21 is a perspective view illustrating the prior art window structure of a semiconductor laser.

FIG. 15(*a*) is a perspective view illustrating a facet window structure semiconductor laser according to a sixth embodiment of the present invention and FIG. 15(*b*) is a cross section along line 15*b*—15*b* in FIG. 15(*a*).

In the figures, reference numeral 250 designates a p type GaAs substrate. An n type GaAs current blocking layer 251 is disposed on the substrate 250. A stripe shaped groove having a U-shaped cross section reaching the substrate 250 is provided on the current blocking layer 251. A p type AlGaAs lower cladding layer 252 is disposed on the current blocking layer 251 and in the stripe shaped groove. A quantum well active layer 253 is disposed on the lower cladding layer 252, and an n type AlGaAs first upper cladding layer 254 is disposed on the active layer 253. A lattice mismatched layer 260 comprising GaInP having a smaller lattice constant than that of GaAs is disposed on the first upper cladding layer 254, an n type AlGaAs second upper cladding layer 255 is disposed on the lattice mismatched layer 260 and on the first upper cladding layer 254, and an n type GaAs contact layer 256 is disposed on the second upper cladding layer 255.

A description is given of the fabrication process. First of all, after an n type current blocking layer 251 is crystalline grown on the p type GaAs substrate 250, a stripe shaped V groove penetrating the current blocking layer 251 and reaching the substrate 250 is formed at the element central portion. Thereafter, the p type AlGaAs lower cladding layer 252, the p type AlGaAs active layer 253, and the n type AlGaAs first upper cladding layer 254 are successively grown on the wafer. The layer thickness of the first upper cladding layer 254 is set so that the distance from the upper end of the well layers forming the quantum well structure of the active layer 253 to the lattice mismatched layer 260 formed on the first upper cladding layer 254 in the later process is more than 0.03 μm and below 0.08 μm.

After the lattice mismatched layer 260 comprising GaInP of a composition having a smaller lattice constant than that of GaAs is crystalline grown on the entire surface of the first upper cladding layer 254, and thereafter employing the conventional photolithography and etching, the lattice mismatched layer disposed at other than the region for the laser emitting facet and the vicinity thereof is removed. The region of the quantum well active layer 253 directly below the lattice mismatched layer 260 is subjected to a compressive stress by the lattice mismatched layer 260, and the energy band gap thereof becomes larger than elsewhere.

Thereafter, the n type AlGaAs second upper cladding layer 255, and the n type GaAs contact layer 256 are successively crystalline grown on the entire surface of the wafer. After the wafer is polished to a desired thickness, the wafer is cleaved into a bar shape having a width corresponding to the resonator length. The resonator length of the typical high output semiconductor laser is 300–600 μm. Electrodes 257 and 258 are formed, and coating of the window layer facet is performed, followed by chip separation to complete laser chips.

In the semiconductor laser according to this embodiment, a lattice mismatched layer 260 comprising a material having a smaller lattice constant than that of the substrate is disposed on the predetermined portion on the first upper cladding layer having a prescribed layer thickness formed on the quantum well active layer 253, and the energy band gap of the active layer 253 in the region directly below the lattice mismatched layer 260 is made larger than elsewhere, whereby a semiconductor laser with a window structure can be produced with high reproducibility and high controllability without performing a complicated process of epitaxial growth on the cleaved facet.

In the above-described sixth embodiment, a lattice mismatched layer comprising a material having a smaller lattice constant than that of the substrate is provided at the portion for a laser emitting facet and the vicinity thereof on the first upper cladding layer, but a lattice mismatched layer comprising a material having a larger lattice constant than that of the substrate may be provided at a region other than in the vicinity of the laser emitting facet, that is, the region inside the laser, and the energy band gap of the active layer direct below the lattice mismatched layer can be made small and the same effect as in the above-described embodiment is obtained.

In the above-described sixth embodiment, although the layer thickness of the first upper cladding layer is made uniform and a lattice mismatched layer is provided partially in the resonator length direction, the layer thickness of the first upper cladding layer may be different between the vicinity of the laser emitting facet and the region inside the laser, and the lattice mismatched layer may be provided over the entire length of the resonator length, and the same effect as in the above-described embodiment is obtained.

As is evident from the forgoing description, according to the present invention, a lattice mismatched layer is disposed above a quantum well structure layer simultaneously epitaxially grown so as to differentiate the energy band gap of the quantum well structure layer partially, whereby the active layer of the semiconductor laser and the light absorption layer of the light modulator are formed. Therefore, the active layer of the semiconductor laser and the light absorption layer of the light modulator can be the same uniform thickness semiconductor layer, and the transmission efficiency of the laser light generated in the semiconductor laser to the light modulator can be increased to a great extent relative to the prior art device. In addition, the active layer of the semiconductor laser and the light absorption layer of the light modulator are formed not by employing a selective growth or the like but by the conventional first time epitaxial growth, whereby the quality of the semiconductor layer for the active layer of the semiconductor laser and the light absorption layer of the light modulator that greatly affects the device characteristics, can be made quite superior, and an integrated semiconductor laser and light modulator having a high reliability and a lengthy lifetime is obtained.

According to the present invention, a lattice mismatched layer is disposed above the quantum well active layer so as to differentiate the energy band gap of the quantum well active layer partially. Therefore, a window structure having a larger energy band gap in the vicinity of the light emitting facet than that of the active layer inside the laser is provided, whereby a complicated process of such as epitaxial growth onto a cleaved facet is not required and a semiconductor laser with a window structure can be produced with high reproducibility and high controllability.

What is claimed is:

1. An integrated semiconductor laser and light modulator comprising:

a semiconductor substrate having a lattice constant;

a semiconductor laser disposed at a first region of the semiconductor substrate; and a light modulator of an electric field absorbing type disposed at a second region of the semiconductor substrate adjacent to the first region for outputting modulated light by transmitting and absorbing light generated in the semiconductor laser, said semiconductor laser and said light modulator including semiconductor laminated layer structures including a quantum well structure layer in the first region and the second region and a lattice mismatched layer comprising a semiconductor material having a lattice constant smaller than the lattice constant of the semiconductor substrate in the second region.

2. The integrated semiconductor laser and light modulator of claim 1 wherein the quantum well structure layer includes a plurality of well layers and the minimum distance from a well layer of the quantum well structure layer to the lattice mismatched layer is more than 0.03 μm and the maximum distance from a well layer of the quantum well structure layer to the lattice mismatched layer is less than 0.08 μm.

3. The integrated semiconductor laser and light modulator of claim 1 wherein:

the semiconductor substrate is InP;

the semiconductor laminated layer structure includes at least some of InP, InGaAs, and InGaAsP layers; and said lattice mismatched layer is GaInP.

4. An integrated semiconductor laser and light modulator comprising:

a semiconductor substrate having a lattice constant;

a semiconductor laser disposed at a first region of the semiconductor substrate; and a light modulator of an electric field absorbing type disposed at a second region of the semiconductor substrate adjacent to the first region for outputting modulated light by transmitting and absorbing light generated in the semiconductor laser, said semiconductor laser and said light modulator including semiconductor laminated layer structures including a quantum well structure layer in the first region and the second region and a lattice mismatched layer comprising a semiconductor material having a lattice constant larger than the lattice constant of the semiconductor substrate in the first region.

5. The integrated semiconductor laser and light modulator of claim 4 wherein the quantum well structure layer includes a plurality of well layers and the minimum distance from a well layer of the quantum well structure layer to the lattice mismatched layer is more than 0.03 μm and the maximum distance from a well layer of the quantum well structure layer to the lattice mismatched layer is less than 0.08 μm.

6. The integrated semiconductor laser and light modulator of claim 4 wherein:

the semiconductor substrate is INP;

the semiconductor laminated layer structure includes at least some of InP, InGaAs, and InGaAsP layers; and said lattice mismatched layer is InAsP.

7. An integrated semiconductor laser and light modulator comprising:

a semiconductor substrate having a lattice constant;

a semiconductor laser disposed at a first region of the semiconductor substrate; and a light modulator of an electric field absorbing type disposed at a second region of the semiconductor substrate adjacent to the first region for outputting modulated light by transmitting and absorbing light generated in the semiconductor laser, said semiconductor laser and said light modulator including semiconductor laminated layer structures including a quantum well structure layer in the first region and the second region and a lattice mismatched layer comprising a semiconductor material having a lattice constant smaller than the lattice constant of the semiconductor substrate in the first and second regions wherein the thickness from a well layer of the quantum well structure layer of the lattice mismatched layer is t1 in the first region and t2 in the second region, where t1>t2.

8. The integrated semiconductor laser and light modulator of claim 1 wherein one of t1 and t2 is more than 0.08 μm and one of t1 and t2 is less than 0.08 μm.

9. The integrated semiconductor laser and light modulator of claim 7 wherein;

the semiconductor substrate is InP;

the semiconductor laminated layer structure includes at least some of InP, InGaAs, and InGaAsP layers; and said lattice mismatched layer is GaInP.

10. An integrated semiconductor laser and light modulator comprising:

a semiconductor substrate having a lattice constant;

a semiconductor laser disposed at a first region of the semiconductor substrate; and a light modulator of an electric field absorbing type disposed at a second region of the semiconductor substrate adjacent to the first region for outputting modulated light by transmitting and absorbing light generated in the semiconductor laser, said semiconductor laser and said light modulator including semiconductor laminated layer structures including a quantum well structure layer in the first region and the second region and a lattice mismatched layer comprising a semiconductor material having a lattice constant smaller than the lattice constant of the semiconductor substrate in the first and second regions wherein the thickness from a well layer of the quantum well structure layer of the lattice mismatched layer is t1 in the first region and t2 in the second region, where t1<t2.

11. The integrated semiconductor laser and light modulator of claim 10 wherein one of t1 and t2 is more than 0.08 μm and one of t1 and t2 is less than 0.08 μm.

12. The integrated semiconductor laser and light modulator of claim 10 wherein:

the semiconductor substrate is InP;

the semiconductor laminated layer structure includes at least some of InP, InGaAs, and InGaAsP layers; and said lattice mismatched layer is InAsP.

13. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a quantum well structure layer on the first region and the second region of the semiconductor substrate;

forming a lattice mismatched layer comprising a semiconductor material having a lattice constant smaller than the lattice constant of the semiconductor substrate on the semiconductor laminated layer structure; and etching and removing the portion of the lattice mismatched layer in the first region.

14. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a quantum well structure layer on the first region and the second region of the semiconductor substrate;

forming an insulating film on the semiconductor laminated layer structure and patterning the insulating film into a configuration having an aperture on the semiconductor laminated layer structure in the second region; and forming a lattice mismatched layer comprising a semiconductor material having a lattice constant smaller than the lattice constant of the semiconductor substrate selectively on the semiconductor laminated layer structure in the second region employing the patterned insulating film as a selective growth mask.

15. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a quantum well structure layer on the first region and the second region of the semiconductor substrate;

forming a lattice mismatched layer comprising a semiconductor material having a lattice constant larger than the lattice constant of the semiconductor substrate selectively on the semiconductor laminated layer structure; and etching and removing the portion of the lattice mismatched layer in the second region.

16. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a quantum well structure layer on the first region and the second region of the semiconductor substrate;

forming an insulating film on the semiconductor laminated layer structure and patterning the insulating film into a configuration having an aperture on the semiconductor laminated layer structure in the first region; and forming a lattice mismatched layer comprising a semiconductor material having a lattice constant larger than the lattice constant of the semiconductor substrate selectively on the semiconductor laminated layer structure employing the patterned insulating film as a selective growth mask.

17. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a continuous semiconductor layer having a larger thickness in the first region than in the second region disposed opposite a quantum well structure layer in the first region and the second region; and forming a lattice mismatched layer comprising a semiconductor material having a lattice constant smaller than the lattice constant of the semiconductor substrate on the semiconductor laminated layer structure continuously in the first and second regions.

18. A method for producing an integrated semiconductor laser and light modulator in which a semiconductor laser is disposed on a first region of a semiconductor substrate and a light modulator of an electric field absorbing type is disposed at a second region on the semiconductor substrate adjacent to the first region for outputting modulated light by transmitting and absorbing light generated in the semiconductor laser comprising:

forming a semiconductor laminated layer structure including a continuous semiconductor layer having a larger thickness in the first region than in the second region disposed opposite a quantum well structure layer in the first region and the second region; and forming a lattice mismatched layer comprising a semiconductor material having a lattice constant larger than the lattice constant of the semiconductor substrate on the semiconductor laminated layer structure continuously in the first and second regions.

19. A semiconductor laser comprising:

a semiconductor substrate having a lattice constant;

a semiconductor laminated layer structure including an active layer having a quantum well structure disposed on the semiconductor substrate;

a lattice mismatched layer comprising a semiconductor material having a smaller lattice constant than the lattice constant of the semiconductor substrate disposed at a region of the semiconductor laminated layer structure; and a light emitting facet including a portion of the active layer directly opposite the region where the lattice mismatched layer is located.

20. The semiconductor laser of claim 19 wherein the quantum well structure layer includes a plurality of well layers and the minimum distance from a well layer of the quantum well structure layer to the lattice mismatched layer is more than 0.03 μm and the maximum distance from a well layer of the quantum well structure layer to the lattice mismatched layer is less than 0.08 μm.

21. The semiconductor laser of claim 19 wherein:

the semiconductor substrate is GaAs;

the semiconductor laminated layer structure includes at least some of GaAs, AlGaAs, GaInP, and AlGaInP layers; and the lattice mismatched layer is a GaInP layer which has a smaller lattice constant than GaAs.

22. A semiconductor laser comprising:

a semiconductor substrate having a lattice constant;

a semiconductor laminated layer structure including an active layer having a quantum well structure disposed on the semiconductor substrate;

a lattice mismatched layer comprising a semiconductor material having a larger lattice constant than the lattice constant of the semiconductor substrate disposed above a region of the semiconductor laminated layer structure; and a light emitting facet including a portion of the active layer directly opposite the region where the lattice mismatched layer is absent.

23. The semiconductor laser of claim 22 wherein the quantum well structure layer includes a plurality of well layers and the minimum distance from a well layer of the quantum well structure layer to the lattice mismatched layer is more than 0.03 μm and the maximum distance from a well layer of the quantum well structure layer to the lattice mismatched layer is less than 0.08 μm.

24. The semiconductor laser of claim 22 wherein:

the semiconductor substrate is GaAs;

the semiconductor laminated layer structure includes at least some of GaAs, AlGaAs, GaInP, and AlGaInP layers; and the lattice mismatched layer is a GaInP layer which has a larger lattice constant than GaAs.

25. A semiconductor laser comprising:

a semiconductor substrate having a lattice constant;

a semiconductor laminated layer structure including an active layer having a quantum well structure and a semiconductor layer having a smaller thickness in a prescribed region than at another portion disposed on the semiconductor substrate;

a lattice mismatched layer comprising a semiconductor material having a smaller lattice constant than the lattice constant of the semiconductor substrate disposed at a region of the semiconductor laminated layer structure; and a light emitting facet including the region of the semiconductor laminated layer structure having the semiconductor layer of the smaller thickness.

26. The semiconductor laser of claim 25 wherein the quantum well structure layer includes a plurality of well layers and the minimum distance from a well layer of the quantum well structure layer to the lattice mismatched layer at the portion of the semiconductor laminated layer structure having the semiconductor layer of larger thickness is more than 0.08 μm and the maximum distance from the well layer of the quantum well structure layer to the lattice mismatched layer at the portion of the semiconductor laminated layer structure having the semiconductor layer of the smaller thickness is less than 0.08 μm.

27. The semiconductor laser of claim 25 wherein:
the semiconductor substrate is GaAs;
the semiconductor laminated layer structure includes at least some of GaAs, AlGaAs, GaInP, and AlGaInP layers; and
the lattice mismatched layer is a GaInP layer which has a smaller lattice constant than GaAs.

28. A semiconductor laser comprising:
a semiconductor substrate having a lattice constant;
a semiconductor laminated layer structure including an active layer having a quantum well structure and a semiconductor layer having a larger thickness in a region than at another portion disposed on the semiconductor substrate;
a lattice mismatched layer comprising a semiconductor material having a larger lattice constant than the lattice constant of the semiconductor substrate disposed at a region of the semiconductor laminated layer structure; and
a light emitting facet including the region of the semiconductor laminated layer structure having the semiconductor layer of the larger thickness.

29. The semiconductor laser of claim 28 wherein the quantum well structure layer includes a plurality of well layers and the minimum distance from a well layer of the quantum well structure layer to the lattice mismatched layer at the portion of the semiconductor laminated layer structure having the semiconductor layer of larger thickness is more than 0.08 μm and the maximum distance from the well layer of the quantum well structure layer to the lattice mismatched layer at the portion of the semiconductor laminated layer structure having the semiconductor layer of the smaller thickness is less than 0.08 μm.

30. The semiconductor laser of claim 28 wherein:
the semiconductor substrate is GaAs;
the semiconductor laminated layer structure includes at least some of GaAs, AlGaAs, GaInP, and AlGaInP layers; and
the lattice mismatched layer is a GaInP layer which has a larger lattice constant than GaAs.

31. A method for producing a semiconductor laser comprising:
forming a semiconductor laminated layer structure including an active layer having a quantum well structure on a semiconductor substrate;
forming a lattice mismatched layer comprising a semiconductor material having a lattice constant smaller than that of the semiconductor substrate on the semiconductor laminated layer structure; and
etching and removing the lattice mismatched layer except for portions adjacent light emitting facets.

32. A method for producing a semiconductor laser comprising:
forming a semiconductor laminated layer structure including an active layer having a quantum well structure on a semiconductor substrate;
forming an insulating film on the semiconductor laminated layer structure and patterning the insulating film into a configuration having an aperture on the semiconductor laminated layer structure at a portion including a region for a light emitting facet; and
forming a lattice mismatched layer comprising a semiconductor material having a lattice constant smaller than the lattice constant of the semiconductor substrate selectively on the semiconductor laminated layer structure including the region for a light emitting facet employing the patterned insulating film as a selective growth mask.

33. A method for producing a semiconductor laser comprising:
forming a semiconductor laminated layer structure including an active layer having a quantum well structure on a semiconductor substrate;
forming a lattice mismatched layer comprising a semiconductor material having a lattice constant larger than that of the semiconductor substrate on the semiconductor laminated layer structure; and
etching and removing the lattice mismatched layer only at portions adjacent light emitting facets.

34. A method for producing a semiconductor laser comprising:
forming a semiconductor laminated layer structure including an active layer having a quantum well structure on a semiconductor substrate;
forming an insulating film on the semiconductor laminated layer structure and patterning the insulating film into a configuration having an aperture on the semiconductor laminated layer structure at a portion except for a region including a light emitting facet and the vicinity thereof; and
forming a lattice mismatched layer comprising a semiconductor material having a lattice constant larger than the lattice constant of the semiconductor substrate selectively on the semiconductor laminated layer structure except for the region including the light emitting facet and the vicinity thereof employing the patterned insulating film as a selective growth mask.

35. A method for producing a semiconductor laser comprising:
forming on a semiconductor substrate a semiconductor laminated layer structure including a semiconductor layer disposed on and opposite an active layer of a quantum well structure, the layer being thinner in a region including a light emitting facet and the vicinity thereof than elsewhere; and
forming a lattice mismatched layer comprising a semiconductor material having a lattice constant smaller than the lattice constant of the semiconductor substrate on the the semiconductor laminated layer structure.

36. A method for producing a semiconductor laser comprising:
forming on a semiconductor substrate a semiconductor laminated layer structure including a semiconductor layer disposed on an active layer of a quantum well structure, the layer being thicker in a region including a light emitting facet and the vicinity thereof than elsewhere; and
forming a lattice mismatched layer comprising a semiconductor material having a lattice constant larger than the lattice constant of the semiconductor substrate on the the semiconductor laminated layer structure.

* * * * *